United States Patent
Iihara et al.

(10) Patent No.: US 10,538,075 B2
(45) Date of Patent: Jan. 21, 2020

(54) SILICONE COMPOSITION FOR PRINTING PLATES, LITHOGRAPHIC PRINTING PLATE MASTER, LITHOGRAPHIC PRINTING PLATE AND METHOD OF PRODUCING PRINTED MATTER

(71) Applicant: TORAY INDUSTRIES, INC., Tokyo (JP)

(72) Inventors: Akihiro Iihara, Otsu (JP); Yasunori Kuse, Otsu (JP); Seiichiro Murase, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 268 days.

(21) Appl. No.: 15/559,663

(22) PCT Filed: Mar. 15, 2016

(86) PCT No.: PCT/JP2016/058159
§ 371 (c)(1),
(2) Date: Sep. 19, 2017

(87) PCT Pub. No.: WO2016/158387
PCT Pub. Date: Oct. 6, 2016

(65) Prior Publication Data
US 2019/0099995 A1 Apr. 4, 2019

(30) Foreign Application Priority Data

Mar. 27, 2015 (JP) .................................. 2015-066012

(51) Int. Cl.
*C08L 83/04* (2006.01)
*C08G 77/20* (2006.01)
(Continued)

(52) U.S. Cl.
CPC .............. *B41C 1/1016* (2013.01); *B41M 1/08* (2013.01); *B41N 1/003* (2013.01); *C08L 83/04* (2013.01);
(Continued)

(58) Field of Classification Search
None
See application file for complete search history.

(56) References Cited

U.S. PATENT DOCUMENTS

2004/0031409 A1 2/2004 Hirano et al.

FOREIGN PATENT DOCUMENTS

JP 2001-26184 A 1/2001
JP 2003-307835 A 10/2003
(Continued)

OTHER PUBLICATIONS

International Search Report for PCT/JP2016/058159 (PCT/ISA/210) dated Jun. 14, 2016.

(Continued)

*Primary Examiner* — Joshua D Zimmerman
(74) *Attorney, Agent, or Firm* — Birch, Stewart, Kolasch & Birch, LLP

(57) ABSTRACT

The present invention provides a silicone composition for use in a printing plate, the composition including at least: a SiH group-containing compound; a compound represented by the following general formula (I); a compound represented by the following general formula (II); and/or a compound represented by the following general formula (III); wherein Ds in the compound represented by the general formula (I), Gs in the compound represented by the general formula (II) and Js in the compound represented by the general formula (III) each represents an acetoxy group or a dialkyloximino group: A-Si-(D)$_3$ (I) (wherein in the general formula (I), A represents a non-hydrolyzable functional (Continued)

group capable of undergoing a hydrosilylation reaction with a SiH group); E-Si-$(G)_3$ (II) (wherein in the general formula (II), E represents a non-hydrolyzable functional group incapable of undergoing a hydrosilylation reaction with a SiH group); and Si-$(J)_4$ (III). An object of the present invention is to provide a silicone composition for use in a printing plate, for obtaining a planographic printing plate precursor or a planographic printing plate which includes a silicone rubber layer having an excellent adhesion to an underlying layer despite being a fast-curing silicone rubber layer, and which has an excellent ink repellency and scratch resistance.

20 Claims, 1 Drawing Sheet

(51) Int. Cl.
*C08G 77/12* (2006.01)
*B41C 1/10* (2006.01)
*G03F 7/11* (2006.01)
*B41M 1/08* (2006.01)
*B41N 1/00* (2006.01)
*G03F 7/00* (2006.01)

(52) U.S. Cl.
CPC .................. *G03F 7/00* (2013.01); *G03F 7/11* (2013.01); *B41C 2210/02* (2013.01); *B41C 2210/04* (2013.01); *B41C 2210/16* (2016.11); *B41C 2210/24* (2013.01); *C08G 77/12* (2013.01); *C08G 77/20* (2013.01)

(56) References Cited

FOREIGN PATENT DOCUMENTS

| | | |
|---|---|---|
| JP | 2007-219358 A | 8/2007 |
| JP | 2010-131980 A | 6/2010 |
| JP | 2011-34114 A | 2/2011 |

OTHER PUBLICATIONS

Written Opinion of the International Searching Authority for PCT/JP2016/058159 (PCT/ISA/237) dated Jun. 14, 2016.

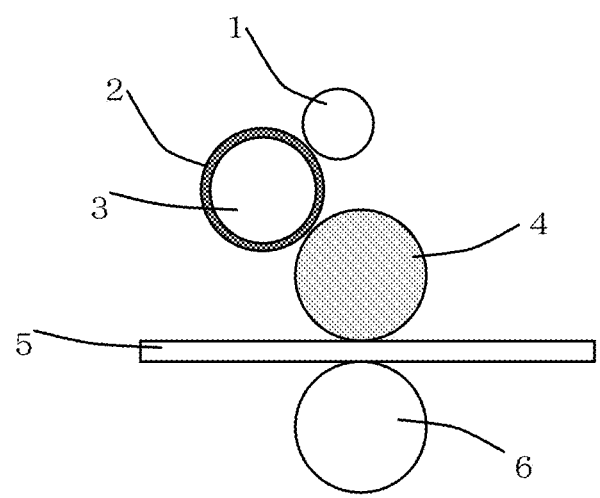

SILICONE COMPOSITION FOR PRINTING PLATES, LITHOGRAPHIC PRINTING PLATE MASTER, LITHOGRAPHIC PRINTING PLATE AND METHOD OF PRODUCING PRINTED MATTER

TECHNICAL FIELD

The present invention relates to a silicone composition for use in a printing plate, a planographic printing plate precursor, a planographic printing plate, and a method of producing a printed matter.

BACKGROUND ART

There are various types of printing methods such as relief printing, intaglio printing, stencil (screen) printing and planographic printing, and printing is performed utilizing the characteristics of the respective methods.

In particular, planographic printing is advantageous as compared to other printing methods, in terms of its ability to provide a printed matter having a high definition, and a lower total cost of printing, including running cost.

The planographic printing is a printing method which utilizes a printing plate in which an image area having ink acceptability and a non-image area having ink repellency are provided substantially on the same plane, and in which method the difference in ink adhesion between these areas is utilized to allow an ink to adhere only to the image area, followed by transferring the adhered ink to a medium to be printed, such as a paper, to achieve printing. Printing plates for use in planographic printing (hereinafter, referred to as planographic printing plates) are largely classified into two types: one in which the action of dampening water is utilized to impart ink repellency to the non-image area; and one in which a silicone rubber or a fluorine resin is used for forming the ink-repellent non-image area, and which does not require the use of dampening water.

A variety of proposals have been made regarding such a planographic printing plate in which a silicone rubber or a fluorine resin is used for forming the ink-repellent non-image area.

PRIOR ART DOCUMENTS

Patent Documents

For example, Patent Document 1 discloses a planographic printing plate precursor including a condensation reaction (wet curing) type silicone rubber layer as an ink repellent layer.

Further, Patent Document 2 discloses a planographic printing plate precursor including an addition reaction type silicone rubber layer as an ink repellent layer.

In addition, Patent Document 3 discloses a planographic printing plate precursor including an addition reaction type silicone rubber layer as an ink repellent layer, wherein the silicone rubber layer contains a silane coupling agent containing an unsaturated group.

Various proposals have also been made regarding inks to be used in the planographic printing which utilizes a planographic printing plate in which a silicone rubber or a fluorine resin is used for forming the ink-repellent non-image area.

For example, Patent Document 4 discloses a UV ink which is instantly cured by the irradiation of UV light.

Further, Patent Document 5 discloses an aqueous ink which contains more than a certain amount of water in its composition.

Patent Document 1: JP 2006-276597 A (Claims))
Patent Document 2: JP 2007-90522 A (Examples)
Patent Document 3: JP 2000-272266 A (Claims)
Patent Document 4: JP 5158274 B (Claims)
Patent Document 5: JP 2007-177191 A (Claims)

SUMMARY OF THE INVENTION

Problems to be Solved by the Invention

The condensation reaction (wet curing) type silicone rubber layer disclosed in the above described Patent Document 1 is slow curing, and when an interleaving paper is laminated immediately after the coating and drying of a coating liquid, there are cases where the interleaving paper may stick to the resulting silicone rubber layer which has not yet been cured. Therefore, it is necessary to laminate a cover film on the uncured silicone rubber layer, after the coating and drying of the coating liquid. Accordingly, there are problems that an operation or an apparatus for removing the cover film before the development is required, and that the removed cover film needs to be disposed as a waste. In addition, it is necessary to add an excessive amount of crosslinking agent in order to reduce the gelation of the coating liquid due to contamination with water, which results in a problem of reduced ink repellency. In the addition reaction type silicone rubber layer disclosed in the above described Patent Document 2, on the other hand, it is not necessary to provide a cover film on the silicone rubber layer, since the silicone rubber layer is fast curing, and, even if an interleaving paper is brought into contact with the silicone rubber layer immediately after heating, there is no risk of the interleaving paper sticking to the silicone rubber layer. Accordingly, this silicone rubber layer has an advantage that it does not require an operation or an apparatus for removing the cover film before the development, and that no waste is produced due to the use of the cover film. However, the disclosed silicone rubber layer does not contain an adhesive component which allows for adhesion to a photothermal conversion layer, which is a layer (hereinafter, referred to as underlying layer) provided underneath the silicone rubber layer and in direct contact with the silicone rubber layer. Therefore, the adhesion between the silicone rubber layer and the photothermal conversion layer is extremely weak, and there are cases where the portions of the silicone rubber layer intended to be retained are easily peeled off during the steps of plate making, printing, and the like. The above described Patent Document 3 proposes the incorporation, into the addition reaction type silicone rubber layer, of a silane coupling agent containing an unsaturated group, as an adhesive component for facilitating adhesion to a heat sensitive layer, which is an underlying layer of the silicone rubber layer. Although the incorporation of the silane coupling agent containing an unsaturated group improves the adhesive strength to the heat sensitive layer, which is the underlying layer, it is necessary to add more than a certain amount of silane coupling agent containing an unsaturated group, in order to obtain a sufficient adhesive strength to the heat sensitive layer. Unsaturated groups contained in the silane coupling agent undergo a hydrosilylation reaction with SiH groups contained in a SiH group-containing compound, which is used as a crosslinking agent in the addition reaction type silicone rubber layer. Accordingly, when more than a certain amount of silane coupling agent containing an unsaturated group is added to the silicone rubber layer, a large amount of SiH group-containing compound needs to be added in order to secure the curability of the silicone rubber layer, causing a problem of reduced ink repellency. Because of this, it has been extremely difficult to obtain both the adhesion to an underlying layer and the ink repellency in a balanced manner, when an addition reaction type silicone rubber layer is used. In particular, various types of inks disclosed in the above described Patent Documents 4 and 5 have a markedly inferior scumming resistance as compared to conventional oil-based inks (oxidative polymerization method). Therefore, when these inks are used with the conventionally known planographic printing plates such as those disclosed in the above described Patent Documents 1 to 3, it has been unable to obtain decent printed matters, due to their insufficient ink repellency.

Accordingly, an object of the present invention is to solve the above described problems associated with the prior art, and to provide a silicone composition for use in a printing plate, for obtaining a planographic printing plate precursor or a planographic printing plate which includes a silicone rubber layer having an excellent adhesion to an underlying layer despite being a fast-curing silicone rubber layer, and which has an excellent ink repellency and scratch resistance.

Means for Solving the Problems

In order to solve the above mentioned problems, the silicone composition for use in a printing plate according to the present invention has any one of the following three constitutions. In other words, the present invention provides:

a silicone composition for use in a printing plate, the composition including at least: a SiH group-containing compound; a compound represented by the following general formula (I); and a compound represented by the following general formula (II); wherein Ds in the compound represented by the general formula (I) and Gs in the compound represented by the general formula (II) each represents an acetoxy group or a dialkyloximino group:

A-Si-(D)$_3$          (I)

(wherein in the general formula (I), A represents a non-hydrolyzable functional group capable of undergoing a hydrosilylation reaction with a SiH group)

E-Si-(G)$_3$          (II)

(wherein in the general formula (II), E represents a non-hydrolyzable functional group incapable of undergoing a hydrosilylation reaction with a SiH group); or a silicone composition for use in a printing plate, the composition including at least: a SiH group-containing compound; a compound represented by the general formula (I); and a compound represented by the following general formula (III); wherein Ds in the compound represented by the general formula (I) and Js in the compound represented by the general formula (III) each represents an acetoxy group or a dialkyloximino group:

Si-(J)$_4$          (III);

or alternatively, a silicone composition for use in a printing plate, the composition including at least: a SiH group-containing compound; a compound represented by the general formula (I); a compound represented by the general formula (II); and a compound represented by the general formula (III); wherein Ds in the compound represented by the general formula (I), Gs in the compound represented by the general formula (II) and Js in the compound represented by the general formula (III) each represents an acetoxy group or a dialkyloximino group.

Further, the planographic printing plate precursor according to the present invention has the following constitution. In other words, the present invention provides:

a planographic printing plate precursor including: a substrate; and at least a silicone rubber layer provided on the substrate; wherein the silicone rubber layer is a cured product obtained by curing the above described silicone composition for use in a printing plate.

The method of producing a planographic printing plate precursor according to the present invention has the following constitution. In other words, the present invention provides:

a method of producing a planographic printing plate precursor, the precursor including: a substrate; and at least a silicone rubber layer provided on the substrate; and the method including the step of curing any one of the above described silicone compositions for use in a printing plate, with or without heating, to form the silicone rubber layer.

Further, the method of producing a planographic printing plate according to the present invention has the following constitution. In other words, the present invention provides:

a method of producing a planographic printing plate, using the above described planographic printing plate precursor or a planographic printing plate precursor obtained by the above described method of producing a planographic printing plate precursor.

The method of producing a printed matter according to the present invention has the following constitution. In other words, the present invention provides:

a method of producing a printed matter, using an ink, and a planographic printing plate obtained by the above described method of producing a planographic printing plate.

In the silicone composition for use in a printing plate according to the present invention, A in the compound represented by the general formula (I) is preferably a vinyl group.

In the silicone composition for use in a printing plate according to the present invention, E in the compound represented by the general formula (II) is preferably a functional group represented by the following general formula (IV):

[Chem. 1]

(IV)

(wherein in the general formula (IV), each X represents a halogen atom or any one of linear, branched, and cyclic saturated hydrocarbon groups having from 1 to 6 carbon atoms; and n represents an integer of from 0 to 5).

In the silicone composition for use in a printing plate according to the present invention, the ratio of the number of SiH groups to the number of functional groups capable of undergoing a hydrosilylation reaction with SiH groups (number of SiH groups/number of functional groups capable of undergoing a hydrosilylation reaction with SiH groups), contained in the silicone composition for use in a printing plate, is preferably 1 or more and 2 or less.

In the silicone composition for use in a printing plate according to the present invention, it is preferred that the content of the compound represented by the general formula (I) be within the range of from 0.5 to 2% by mass with respect to the total amount of the silicone composition for use in a printing plate, and the content of the compound represented by the general formula (II) and/or the compound represented by the general formula (III) be within the range of from 0.5 to 5.5% by mass with respect to the total amount of the silicone composition for use in a printing plate. At the same time, it is preferred that the total of the content (% by mass) of the compound represented by the general formula (I) and the content (% by mass) of the compound represented by the general formula (II) and/or the compound represented by the general formula (III) be within the range of from 2.5 to 6% by mass, with respect to the total amount of the silicone composition for use in a printing plate.

It is preferred that the silicone composition for use in a printing plate according to the present invention further includes a silanol group-containing silicone compound.

It is preferred that the silicone composition for use in a printing plate according to the present invention further includes a liquid having a surface tension at 25° C. of 30 mN/m or less.

In the method of producing a printed matter according to the present invention, the ink is preferably an active energy ray-curable ink.

In the method of producing a printed matter according to the present invention, the ink is preferably an aqueous ink.

Effect of the Invention

According to the present invention, it is possible to obtain a planographic printing plate precursor or a planographic printing plate which includes a silicone rubber layer having an excellent adhesion to an underlying layer despite being a fast-curing silicone rubber layer, and which has an excellent ink repellency and scratch resistance.

BRIEF DESCRIPTION OF THE DRAWING

FIG. 1 is a sectional view illustrating an example of the method of producing a printed matter according to the present invention.

MODE FOR CARRYING OUT THE INVENTION

The silicone composition for use in a printing plate according to the present invention has any one of the following three aspects. In other words, the present invention provides:

a silicone composition for use in a printing plate, the composition including at least: a SiH group-containing compound; a compound represented by the following general formula (I); and a compound represented by the following general formula (II); wherein Ds in the compound represented by the general formula (I) and Gs in the compound represented by the general formula (II) each represents an acetoxy group or a dialkyloximino group:

(wherein in the general formula (I), A represents a non-hydrolyzable functional group capable of undergoing a hydrosilylation reaction with a SiH group)

(wherein in the general formula (II), E represents a non-hydrolyzable functional group incapable of undergoing a hydrosilylation reaction with a SiH group); or a silicone composition for use in a printing plate, the composition including at least: a SiH group-containing compound; a compound represented by the general formula (I); and a compound represented by the following general formula (III); wherein Ds in the compound represented by the general formula (I) and Js in the compound represented by the general formula (III) each represents an acetoxy group or a dialkyloximino group:

or alternatively, a silicone composition for use in a printing plate, the composition including at least: a SiH group-containing compound; a compound represented by the general formula (I); a compound represented by the general formula (II); and a compound represented by the general formula (III); wherein Ds in the compound represented by the general formula (I), Gs in the compound represented by the general formula (II) and Js in the compound represented by the general formula (III) each represents an acetoxy group or a dialkyloximino group.

The present invention will now be described in detail.

First, the silicone composition for use in a printing plate will be described.

The silicone composition for use in a printing plate, to be used in the present invention, includes at least: a SiH group-containing compound; a compound represented by the following general formula (I); a compound represented by the following general formula (II) and/or a compound represented by the following general formula (III). Further, the silicone composition for use in a printing plate preferably includes a vinyl group-containing silicone compound and/or a silanol group-containing silicone compound, and a reaction catalyst. The silicone composition may further include a reaction inhibitor.

(In the general formula (I), A represents a non-hydrolyzable functional group capable of undergoing a hydrosilylation reaction with a SiH group; and each D represents an acetoxy group or a dialkyloximino group.)

(In the general formula (II), E represents a non-hydrolyzable functional group incapable of undergoing a hydrosilylation reaction with a SiH group, and each G represents an acetoxy group or a dialkyloximino group.)

(In the general formula (III), each J represents an acetoxy group or a dialkyloximino group.)

Examples of the SiH group-containing compound include compounds containing three or more SiH groups in one molecule. Examples thereof include organohydropolysiloxanes, organohydrosiloxane.diorganosiloxane copolymers, and compounds containing three or more diorganohydrosiloxy groups in its molecule. Of these, an organohydropolysiloxane, or an organohydrosiloxane.diorganosiloxane copolymer is preferred. Two or more of these compounds may be contained. The number of SiH groups in one molecule of the SiH group-containing compound is preferably 5 or more, and more preferably 6 or more, in terms of improving the curability of the silicone rubber layer.

An organohydropolysiloxane or an organohydrosiloxane-diorganosiloxane copolymer has a linear, branched, or net like molecular structure. The organic groups bound to a silicon atom may be the same as or different from each other, and each represents a monovalent organic group containing no aliphatic unsaturated bond. Examples of the monovalent organic group containing no aliphatic unsaturated bond include: alkyl groups such as methyl group, ethyl group, propyl group, butyl group, pentyl group, hexyl group, and heptyl group; aryl groups such as phenyl group, tolyl group, xylyl group, and naphthyl group; aralkyl groups such as benzyl group and phenethyl group; and halogenated alkyl groups such as chloromethyl group, 3-chloropropyl group, and 3,3,3-trifluoropropyl group.

The content of the SiH group-containing compound in the silicone composition for use in a printing plate is preferably 0.5% by mass or more, and more preferably 1% by mass or more, in terms of improving the curability of the silicone rubber layer. At the same time, the content is preferably 10% by mass or less, and more preferably 5% by mass or less, in terms of improving the ink repellency.

In the compound represented by the above mentioned general formula (I), A in the general formula (I) represents a non-hydrolyzable functional group capable of undergoing a hydrosilylation reaction with a SiH group; and each D in the formula represents an acetoxy group or a dialkyloximino group. When each D is an acetoxy group or a dialkyloximino group, it is possible to improve the reactivity with an underlying layer, which is important for enhancing the adhesive strength of the resulting silicone rubber layer to the underlying layer. Examples of the non-hydrolyzable functional group capable of undergoing a hydrosilylation reaction with a SiH group, represented by A, include vinyl group, allyl group, and (meth)acryloyl group. Specific examples of the compound represented by the general formula (I), as described above, include vinyltriacetoxysilane, allyltriacetoxysilane, acryloxymethyltriacetoxysilane, 2-acryloxyethyltriacetoxysilane, 3-acryloxypropyltriacetoxysilane, methacryloxymethyltriacetoxysilane, 2-methacryloxyethyltriacetoxysilane, 3-methacryloxypropyltriacetoxysilane, vinyltris(methylethylketoximino)silane, allyltris(methylethylketoximino)silane, acryloxymethyltris(methylethylketoximino)silane, 2-acryloxyethyltris(methylethylketoximino)silane, 3-acryloxypropyltris(methylethylketoximino)silane, methacryloxymethyltris(methylethylketoximino)silane, 2-methacryloxyethyltris(methylethylketoximino)silane, and 3-methacryloxypropyltris(methylethylketoximino)silane, but not limited thereto. Among these, vinyltriacetoxysilane, or vinyltris(methylethylketoximino)silane is preferred, in terms of improving the reactivity with the SiH group-containing compound and the ink repellency. In cases where the underlying layer contains a phenolic hydroxyl group, it is particularly suitable to use the compound represented by the general formula (I) in which each D is a dialkylketoximino group. Even the incorporation of a small amount of such a compound serves to provide a high adhesive strength. The reason for this is thought to be that the molecules of the compound represented by the general formula (I) are more likely to be concentrated at the interface between the silicone rubber layer and the underlying layer, since this compound has a high reactivity with an underlying layer, and the dialkyloximino group easily forms a salt with a phenolic hydroxyl group, which is a weak acid.

The content of the compound represented by the general formula (I) in the silicone composition for use in a printing plate is preferably 0.5% by mass or more, in terms of improving the adhesion to an underlying layer. At the same time, the content of the compound in the silicone composition for use in a printing plate is preferably 2% by mass or less, and more preferably 1.5% by mass or less, in terms of improving the ink repellency.

In the compound represented by the above mentioned general formula (II), E in the general formula (II) represents a non-hydrolyzable functional group incapable of undergoing a hydrosilylation reaction with a SiH group; and each G in the formula represents an acetoxy group or a dialkyloximino group. When each G is an acetoxy group or a dialkyloximino group, it is possible to improve the reactivity with an underlying layer, which is important for enhancing the adhesive strength to the underlying layer. Examples of the non-hydrolyzable functional group incapable of undergoing a hydrosilylation reaction with a SiH group, represented by E, include alkyl groups, halogenated alkyl groups, glycidoxy alkyl groups, isocyanatoalkyl groups, and functional groups represented by the above mentioned general formula (IV).

Among these, an alkyl group, a halogenated alkyl group, and a functional group represented by the general formula (IV) are preferred, in terms of improving the reactivity with an underlying layer, which is important for enhancing the adhesive strength to the underlying layer. Specific examples of the compound represented by the general formula (II), as described above, include methyltriacetoxysilane, ethyltriacetoxysilane, chloromethyltriacetoxysilane, fluoromethyltriacetoxysilane, trichloromethyltriacetoxysilane, trifluoromethyltriacetoxysilane, 3-chloropropyltriacetoxysilane, 3-fluoropropyltriacetoxysilane, 3,3,3-trichloropropyltriacetoxysilane, 3,3,3-trifluoropropyltriacetoxysilane, phenyltriacetoxysilane, toluyltriacetoxysilane, xylyltriacetoxysilane, methyltris(methylethylketoximino)silane, ethyltris(methylethylketoximino)silane, chloromethyltris(methylethylketoximino)silane, fluoromethyltris(methylethylketoximino)silane, trichloromethyltris(methylethylketoximino)silane, trifluoromethyltris(methylethylketoximino)silane, 3-chloropropyltris(methylethylketoximino)silane, 3-fluoropropyltris(methylethylketoximino)silane, 3,3,3-trichloropropyltris(methylethylketoximino)silane, 3,3,3-trifluoropropyltris(methylethylketoximino)silane, phenyltris(methylethylketoximino)silane, toluyltris(methylethylketoximino)silane, and xylyltris(methylethylketoximino)silane, but not limited thereto. Among these, more preferred is a compound containing a functional group represented by the general formula (IV), such as phenyltriacetoxysilane, toluyltriacetoxysilane, xylyltriacetoxysilane, phenyltris(methylethylketoximino)silane, toluyltris(methylethylketoximino)silane, or xylyltris(methylethylketoximino)silane, and still more preferred is phenyltriacetoxysilane, or phenyltris(methylethylketoximino)silane. In cases where the underlying layer contains a phenolic hydroxyl group, it is particularly suitable to use the compound represented by the general formula (II) in which each G is a dialkylketoximino group. Even the incorporation of a small amount of such a compound serves to provide a high adhesive strength. The reason for this is thought to be that the molecules of the compound represented by the general formula (II) are more likely to be concentrated at the interface between the silicone rubber layer and the underlying layer, since this compound has a high reactivity with an underlying layer, and the dialkylketoximino group easily forms a salt with a phenolic hydroxyl group, which is a weak acid.

The content of the compound represented by the general formula (II) in the silicone composition for use in a printing plate is preferably 0.5% by mass or more, in terms of improving the adhesion to an underlying layer. At the same time, the content of the compound in the silicone composition for use in a printing plate is preferably 5.5% by mass or less, and more preferably 4.5% by mass or less, in terms of improving the ink repellency.

In the compound represented by the above mentioned general formula (III), each J in the general formula (III) represents an acetoxy group or a dialkyloximino group. When each J is an acetoxy group or a dialkyloximino group, it is possible to improve the reactivity with an underlying layer, which is important for enhancing the adhesive strength to the underlying layer. Specific examples of the compound represented by the general formula (III), as described above, include tetraacetoxysilane, tetrakis(trifluoroacetoxy)silane, tetrakis(methylethylketoximino)silane, and tetrakis(methylisobutylketoximino)silane, but not limited thereto. In cases where the underlying layer contains a phenolic hydroxyl group, it is particularly suitable to use the compound represented by the general formula (III) in which each J is a dialkylketoximino group. Even the incorporation of a small amount of such a compound serves to provide a high adhesive strength. The reason for this is thought to be that the molecules of the compound represented by the general formula (III) are more likely to be concentrated at the interface between the silicone rubber layer and the underlying layer, since this compound has a high reactivity with an underlying layer, and the dialkylketoximino group easily forms a salt with a phenolic hydroxyl group, which is a weak acid.

The content of the compound represented by the general formula (III) in the silicone composition for use in a printing plate is preferably 0.5% by mass or more, because it serves to improve the curability. At the same time, the content of the compound in the silicone composition for use in a printing plate is preferably 1.5% by mass or less, because it serves to improve the scratch resistance.

The silicone composition may include the compound represented by the general formula (II) and the compound represented by the general formula (III) in combination. In cases where the silicone composition include these compounds in combination, the total content of the compound represented by the general formula (II) and the compound represented by the general formula (III) in the silicone composition for use in a printing plate, is preferably 0.5% by mass or more, because it serves to improve the curability can be improved. At the same time, the total content of these compounds in the silicone composition for use in a printing plate is preferably 1.5% by mass or less, because it serves to improve the scratch resistance.

In terms of obtaining both the adhesion to an underlying layer and the ink repellency in a balanced manner, it is preferred that the total of the content (% by mass) of the compound represented by the general formula (I) and the content (% by mass) of the compound represented by the general formula (II) and/or the compound represented by the general formula (III) be within the range of from 2.5 to 6% by mass, with respect to the total amount of the silicone composition for use in a printing plate.

The vinyl group-containing silicone compound may be, for example, a compound represented by the following general formula (V), and is a silicone compound containing two or more vinyl groups in its molecule. In particular, a compound having a vinyl group at each of both ends of the molecular main chain is preferred in terms of improving the curability of the silicone rubber layer. Two or more of these compounds may be contained.

[Chem. 2]

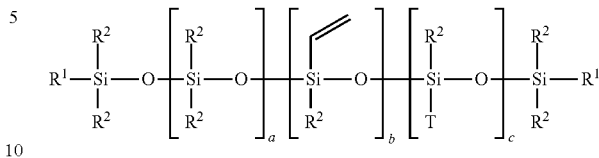

(V)

In the general formula (V), T represents a functional group represented by the following general formula (VI).

[Chem. 3]

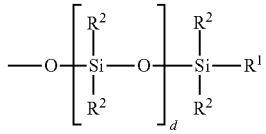

(VI)

In the general formula (V) and (VI), $R^1$ represents either a vinyl group or a monovalent organic group containing no aliphatic unsaturated bond; and $R^2$ represents a monovalent organic group containing no aliphatic unsaturated bond. Examples of the monovalent organic group containing no aliphatic unsaturated bond include: alkyl groups such as methyl group, ethyl group, propyl group, butyl group, pentyl group, hexyl group, and heptyl group; aryl groups such as phenyl group, tolyl group, xylyl group, and naphthyl group; aralkyl groups such as benzyl group, and phenethyl group; and halogenated alkyl groups such as chloromethyl group, 3-chloropropyl group, and 3,3,3-trifluoropropyl group.

In the general formulae (V) and (VI), a represents an integer of from 0 to 4,000, b represents an integer of from 0 to 5, c represents an integer of from 0 to 2,000, and d represents an integer of from 0 to 4,000. When $R^1$ is a monovalent organic group containing no aliphatic unsaturated bond, b represents an integer of 2 or more; and $R^1$ and $R^2$ are independent, and may be the same as or different from each other. Further, at least any one of a, b and c is an integer of 1 or more; and d is 0 or an integer of 1 or more.

In the general formulae (V) and (VI), it is preferred that methyl groups account for 50% by mole or more of all the groups represented by $R^1$, and of all the groups represented by $R^2$, in terms of the ink repellency of the planographic printing plate. The vinyl group-containing silicone compound preferably has a weight average molecular weight of 30,000 or more, in terms of improving the printing durability and the scratch resistance of the resulting printing plate. At the same time, the vinyl group-containing silicone compound preferably has a weight average molecular weight of 300,000 or less, in terms of improving the image reproducibility.

The content of the vinyl group-containing silicone compound in the silicone composition for use in a printing plate is preferably 60% by mass or more, and more preferably 70% by mass or more, in terms of improving the ink repellency of the silicone rubber layer. At the same time, the content is preferably 99% by mass or less, in terms of securing the curability of the silicone rubber layer.

In terms of improving the scratch resistance of the silicone rubber layer, a silanol group-containing silicone compound may be used instead of the above described vinyl group-containing silicone compound. The silanol group-containing silicone compound may be, for example, a compound having a structure represented by the following general formula (VII), and containing a silanol group at an end of the molecule and/or in the main chain.

[Chem. 4]

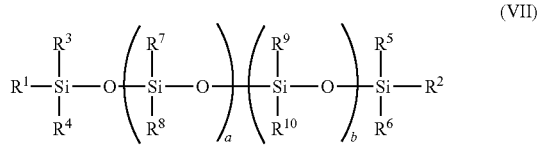

(VII)

In the general formula (VII), each of a and b represents an integer of 1 or more. $R^1$ to $R^{10}$ may be the same as or different from each other, and each represents at least one group selected from the group consisting of hydroxyl group, a substituted or unsubstituted alkyl group having from 1 to 50 carbon atoms, a substituted or unsubstituted alkenyl group having from 2 to 50 carbon atoms, and a substituted or unsubstituted aryl group having from 4 to 50 carbon atoms. However, at least two or more silanol groups are contained in the molecule.

Regarding the positions of the silanol groups in the molecule, preferred is a compound containing two or more silanol groups at the end(s) of the molecule, and in particular, a compound containing two silanol groups in total, one each at both ends of the molecule.

It is preferred that methyl groups account for 50% or more, and still more preferably 80% or more, of all the groups represented by $R^1$ to $R^{10}$ in the general formula (VII), in terms of the ink repellency of the printing plate. Further, in terms of the handleability, and the ink repellency and the scratch resistance of the resulting printing plate, the compound represented by the general formula (VII) preferably has a weight average molecular weight is preferably from 10,000 to 600,000.

The content of the compound represented by the general formula (VII) in the silicone composition for use in a printing plate is preferably 60% by mass or more, and more preferably 70% by mass or more, in terms of improving the scratch resistance of the silicone rubber layer. At the same time, the content is preferably 99% by mass or less, in terms of securing the curability of the silicone rubber layer.

The ratio of the number of SiH groups to the number of functional groups capable of undergoing a hydrosilylation reaction with SiH groups (number of SiH groups/number of functional groups capable of undergoing a hydrosilylation reaction with SiH groups), in the silicone composition for use in a printing plate according to the present invention, is preferably 1 or more and 2 or less. When the ratio of the number of SiH groups to the number of functional groups capable of undergoing a hydrosilylation reaction with SiH groups is 1 or more, the silicone rubber layer can be sufficiently cured, and therefore preferred. Further, when the ratio of the number of SiH groups to the number of functional groups capable of undergoing a hydrosilylation reaction with SiH groups is 2 or less, the ink repellency can be improved, and therefore preferred. The ratio of the number of SiH groups to the number of functional groups capable of undergoing a hydrosilylation reaction with SiH groups is more preferably within the range of from 1.2 to 1.8.

As a curing catalyst, any of those known as hydrosilylation catalysts can be used; however, one containing platinum or rhodium is preferred, because of its high reactivity. Specifically, the curing catalyst may be, for example: a simple substance of platinum, solid platinum supported on a carrier (such as alumina, silica, or carbon black), chloroplatinic acid, a platinum-olefin complex, a platinum-vinylsilane complex, a platinum-vinylsiloxane complex, a platinum-phosphine complex, a platinum-phosphite complex, a platinum-acetylacetone complex, a platinum-acetoacetic acid alkyl ester complex, or a platinum-malonic acid dialkyl ester complex. Alternatively, the curing catalyst may also be, for example, any of the platinum-hydrocarbon complexes disclosed in U.S. Pat. Nos. 3,159,601 and 3,159,662 by Ashby et al., and the platinum alcoholate catalysts disclosed in U.S. Pat. No. 3,220,972 by Lamoreaux et al. Further, examples of the catalyst other than platinum compounds include $RhCl(PPh_3)_3$, $RhCl_3$, $RhAl_2O_3$, $RuCl_3$, $IrCl_3$, $FeCl_3$, $AlCl_3$, $PdCl_2 \cdot 2H_2O$, $NiCl_2$, and $TiCl_4$. These curing catalysts may be used singly, or in combination of two or more kinds The content of the curing catalyst in the silicone composition for use in a printing plate is preferably 0.001% by mass or more, and more preferably 0.01% by mass or more, in terms of improving the curability of the silicone rubber layer. At the same time, the content of the curing catalyst in the silicone composition for use in a printing plate is preferably 20% by mass or less, and more preferably 15% by mass or less, in terms of improving the pot life of the silicone composition for use in a printing plate or a solution of the silicone composition for use in a printing plate.

As the reaction inhibitor, any of those known as hydrosilylation reaction inhibitors and reaction retardants can be used. Preferred is an amine compound or an acetylene compound, and more preferred is pyridine, picoline, 2,2'-dipyridyl, 2-butanone oxime, an acetylene alcohol, acetylene silane, or the like. Examples of the acetylene alcohol include 2-methyl-3-butyn-2-ol, 2-phenyl-3-butyn-2-ol, 1-ethynyl-1-hexanol, 3,5-dimethyl-1-hexyn-3-ol, and 3-methyl-1-pentyn-3-ol. Two or more of these reaction inhibitors may be contained. Incorporation of any of these reaction inhibitors serves to improve the pot life of the silicone composition for use in a printing plate or a solution of the silicone composition for use in a printing plate.

The content of the reaction inhibitor in the silicone composition for use in a printing plate is preferably 0.01% by mass or more, and more preferably 0.1% by mass or more, in terms of improving the pot life silicone composition for use in a printing plate or a solution of the silicone composition for use in a printing plate. At the same time, the content of the reaction inhibitor in the silicone composition for use in a printing plate is preferably 20% by mass or less, and more preferably 15% by mass or less, in terms of securing the curability of the silicone rubber layer.

For the purpose of further improving the ink repellency, the silicone composition for use in a printing plate may include a liquid having a surface tension at 25° C. of 30 mN/m or less. When the silicone composition includes a liquid having a surface tension of 30 mN/m or less, the liquid having a surface tension at 25° C. of 30 mN/m or less exudes to the surface of the resulting silicone rubber layer to facilitate the peeling of the ink, and thus, it is possible to improve the ink repellency and to raise the scumming start temperature. It is more preferred that the liquid have a surface tension at 25° C. of 22 mN/m or less, and still more preferably, 21 mN/m or less, in terms of improving the ink repellency. The surface tension can be measured by the Wilhelmy method (also referred to as a plate method or a vertical plate method), which is a generally known measuring method.

It is preferred that the reduction in mass of the liquid having a surface tension at 25° C. of 30 mN/m or less, after being left to stand for 24 hours at 150° C. in an environment of 1 atm, is 0% by mass or more and 0.5% by mass or less. When the reduction in mass of the liquid, after being left to stand for 24 hours at 150° C. in an environment of 1 atm, is 0% by mass or more and 0.5% by mass or less, the liquid is less susceptible to volatilization during the production or the storage of the planographic printing plate precursor, and thus, the ink repellent effect is less likely to be reduced.

The content of the liquid having a surface tension at 25° C. of 30 mN/m or less in the silicone composition for use in a printing plate is preferably within the range of from 10 to 25% by mass. When the content is 10% by mass or more, the ink repellency is markedly improved; whereas when the content is 25% by mass or less, a sufficient strength of the silicone rubber layer can be secured, thereby enabling to maintain the printing durability.

The liquid having a surface tension at 25° C. of 30 mN/m or less is preferably a silicone compound, and more preferably a silicone oil. The silicone oil as used in the present invention refers to a polysiloxane component which is not involved in the crosslinking in the silicone rubber layer. Specifically, the silicone oil may be, for example, a dimethylsilicone oil such as a trimethylsilyl-terminated polydimethylsiloxane, a cyclic polydimethylsiloxane, a trimethylsilyl-terminated dimethylsiloxane-methylphenylsiloxane copolymer, or a trimethylsilyl-terminated dimethylsiloxane-diphenyl siloxane copolymer. Alternatively, the silicone oil may be, for example, a modified silicone oil in which a part of methyl groups in its molecule is substituted with any of various types of organic groups, such as an alkyl modified silicone oil, a fluorine modified silicone oil, a polyether modified silicone oil, an alcohol modified silicone oil, an amino modified silicone oil, an epoxy modified silicone oil, an epoxy polyether modified silicone oil, a phenol modified silicone oil, a carboxy modified silicone oil, a mercapto modified silicone oil, an amide modified silicone oil, a carnauba modified silicone oil, or a higher fatty acid modified silicone oil.

The liquid having a surface tension at 25° C. of 30 mN/m or less preferably has a weight average molecular weight within the range of from 200 to 100,000. When the liquid having a surface tension at 25° C. of 30 mN/m or less has a weight average molecular weight of 200 or more, the volatilization of the liquid during the production or the storage of the planographic printing plate precursor can be reduced; whereas when the liquid has a weight average molecular weight of 100,000 or less, the bleed-out of the liquid from the silicone rubber layer can be reduced.

The silicone composition for use in a printing plate according to the present invention may contain a solvent, for the purpose of improving the coating properties and the discharge properties of the composition. Note that, in the present invention, a liquid obtained by diluting the silicone composition for use in a printing plate with a solvent is referred to as a solution of the silicone composition for use in a printing plate.

Examples of the solvent include: aliphatic hydrocarbons, alicyclic hydrocarbons, aromatic hydrocarbons, and halogenated hydrocarbons; and linear and cyclic ether compounds. Among these, an aliphatic hydrocarbon or an alicyclic hydrocarbon is preferred, in terms of improving economic efficiency and safety. Further, the solvent preferably has a solubility parameter of 16.4 (MPa) ½ or less, and more preferably 15.4 (MPa) ½ or less, and still more preferably 14.4 (MPa) ½ or less, in terms of improving the solubility of the silicone composition. In addition, the solvent preferably has a boiling point of 60° C. or higher, and more preferably 80° C. or higher, in terms of improving the safety and the handleability. At the same time, the solvent preferably has a boiling point of 150° C. or lower, and more preferably 120° C. or lower, in terms of improving the drying properties of the coating solution. Specific examples of such a solvent include linear and branched aliphatic hydrocarbons having from 6 to 9 carbon atoms; and alicyclic hydrocarbons such as cyclohexane, methylcyclohexane, ethylcyclohexane, dimethylcyclohexane, and trimethylcyclohexane. Two or more of these solvents may be intentionally mixed for use, or alternatively, it is possible to use any of commercially available solvents typically exemplified by those listed below, which are ready-made mixtures of these solvents.

Examples of mixtures of aliphatic hydrocarbons include: "Marukazol" 8 (manufactured by Maruzen Petrochemical Co., Ltd.); "Isopar" C and "Isopar" E (both manufactured by Exxon Mobil Corporation); "IP Solvent" 1016 (manufactured by Idemitsu Kosan Co., Ltd.); and "Isozol" 200 (manufactured by JXTG Nippon Oil & Energy Corporation); and these are available from the respective companies.

Examples of mixtures of alicyclic hydrocarbons include: "Exxsol" DSP80/100, "Exxsol" DSP100/140, and "Exxsol" D30 (all of the above manufactured by Exxon Mobil Corporation); and CS Volatile Oil (manufactured by JXTG Nippon Oil & Energy Corporation); and these are available from the respective companies.

It is also possible to mix and use any of solvents other than those described above. However, it is preferred that the above described solvents be contained in an amount of 80% by volume or more, and more preferably 90% by volume or more, with respect to the total amount of the solvents, in terms of improving the solubility of the silicone composition for use in a printing plate.

Further, the silicone composition for use in a printing plate according to the present invention may contain, in addition to the above described compounds, a known reinforcing agent, such as silica, or a silicone resin containing a functional group, such as a vinyl group, a SiH group or a silanol group, for the purpose of improving the rubber strength.

In addition, the silicone composition for use in a printing plate according to the present invention may contain a colored dye or a colored pigment, such as those disclosed in JP 2002-244279 A and WO 2008/056588, in order to impart plate inspectability to the developed planographic printing plate.

Specific methods for preparing a solution of the silicone composition for use in a printing plate will be described below, but not limited thereto.

For example, a solvent, a vinyl group-containing silicone compound, a liquid having a surface tension at 25° C. of 30 mN/m or less, and a SiH group-containing compound are charged into a container, and start stirring the resultant using a generally known mixer or the like (stirring is continued until the completion of the preparation of a solution of the silicone composition for use in a printing plate). To the resultant, the compound represented by the general formula (I), the compound(s) represented by the general formula (II) and/or (III) are/is added, and the resultant is stirred until the components are mixed homogeneously. Then a reaction inhibitor is added to the resultant, followed by stirring until the components are mixed homogeneously. A curing catalyst is further added to the resultant, followed by stirring until the components are mixed homogeneously, to obtain a solution of the silicone composition for use in a printing plate.

Alternatively, in cases where a silanol group-containing silicone compound is used instead of the vinyl group-containing silicone compound, a solution of the silicone composition for use in a printing plate can be obtained by the following preparation method.

For example, a solvent, a silanol group-containing silicone compound, a liquid having a surface tension at 25° C. of 30 mN/m or less, and a SiH group-containing compound are charged into a container, and start stirring the resultant using a generally known mixer or the like (stirring is continued until the completion of the preparation of a solution of the silicone composition for use in a printing plate). To the resultant, the compound represented by the general formula (I) is added, followed by stirring for 30 minutes or more. Then the compound(s) represented by the general formula (II) and/or (III), and a reaction inhibitor are added to the resultant, followed by stirring until the components are mixed homogeneously. Further, a curing catalyst is added to the resultant, followed by stirring until the components are mixed homogeneously, to obtain a solution of the silicone composition for use in a printing plate.

It is preferred that the curing catalyst be added immediately before the coating of the silicone composition for use in a printing plate or the solution of the silicone composition for use in a printing plate, in terms of maintaining the curability.

Next, a description will be given regarding a planographic printing plate precursor including a substrate, and at least a silicone rubber layer provided on the substrate. The planographic printing plate precursor as used herein refers to a precursor of a planographic printing plate, which is used for producing a planographic printing plate for use in printing.

As the substrate, it is possible to use a known paper, metal plate, glass plate, film or the like, which is dimensionally stable and which has been conventionally used as a substrate of a planographic printing plate. Specific examples thereof include: papers; papers laminated with a plastic (such as polyethylene, polypropylene, or polystyrene), plates of metals such as aluminum (including aluminum alloys), zinc, and copper; glass plates made of soda lime, quartz and the like; silicon wafer; films of plastics such as cellulose acetate, polyethylene terephthalate, polyethylene, polyester, polyamide, polyimide, polystyrene, polypropylene, polycarbonate, and polyvinyl acetal; and papers and plastic films on which any of the above described metals is laminated or vapor-deposited. The plastic film may be a transparent film or a non-transparent film. However, a non-transparent film is preferred, in terms of improving the plate inspectability.

Among these substrates, an aluminum plate is particularly preferred, because it is not only extremely stable in dimension, but also inexpensive. Further, a polyethylene terephthalate film is particularly preferred, as a flexible substrate for light printing.

The thickness of the substrate is not particularly limited, and a thickness compatible with a printing machine used in the printing may be selected.

The silicone rubber layer can be formed by coating the above described silicone composition for use in a printing plate or a solution of the silicone composition for use in a printing plate on a substrate or on another layer provided on the substrate.

In the planographic printing plate precursor according to the present invention, the silicone rubber layer preferably has a film mass within the range of from 0.6 to 10 g/m$^2$. When the film mass of the silicone rubber layer is 0.6 g/m$^2$ or more, the resulting planographic printing plate has a sufficient ink repellency, scratch resistance, and printing durability. When the film mass is 10 g/m$^2$ or less, on the other hand, no disadvantage occurs from the viewpoint of economic efficiency, and a decrease in the image reproducibility and inking quantity is less likely to occur. The film mass is more preferably within the range of from 1 to 5 g/m$^2$.

The planographic printing plate precursor according to the present invention may include a heat sensitive layer or a photosensitive layer between the substrate and the silicone rubber layer, or between the heat insulating layer to be described later and the silicone rubber layer, for the purpose of imparting heat sensitivity or photosensitivity to the plate precursor. The heat sensitive layer or the photosensitive layer to be used in the present invention may be, for example, any of the heat sensitive layers and photosensitive layers described below, but not limited thereto.

<Heat Sensitive Layer-1> Thermally-Meltable Heat Sensitive Layer

A thermally-meltable heat sensitive layer is a type of heat sensitive layer having a cross-linked structure formed by a crosslinking agent, when it is included in a planographic printing plate precursor, and whose adhesive strength to the silicone rubber layer is reduced due to heat generated by the irradiation of a near-infrared laser beam. A subsequent developing treatment removes the portions of the silicone rubber layer irradiated with the laser beam. Most of the portions of the heat sensitive layer irradiated with the laser beam remain after the development. The thermally-meltable heat sensitive layer may be, for example, a layer obtained by coating and (heat) drying: a composition including a polymer containing active hydrogen, a crosslinking agent, and a photothermal conversion material, or a solution thereof; or alternatively, a composition including a polymer containing active hydrogen, an organic complex compound, and a photothermal conversion material, or a solution thereof. The polymer containing active hydrogen is preferably a homopolymer or a copolymer of p-hydroxystyrene, or a polymer containing a phenolic hydroxyl group, such as a novolac resin or a resole resin. Examples of the crosslinking agent include organic complex compounds, multifunctional isocyanates, multifunctional blocked isocyanates, multifunctional epoxy compounds, multifunctional (meth)acrylate compounds, multifunctional aldehydes, multifunctional mercapto compounds, multifunctional alkoxysilyl compounds, multifunctional amine compounds, multifunctional carboxylic acids, multifunctional vinyl compounds, multifunctional diazonium salts, multifunctional azide compounds, and hydrazine. The organic complex compound may be, for example, an acetylacetone complex or an acetoacetic acid ester complex of Al (III), Fe (II), Fe (III), Ti (IV), or Zr (IV). The photothermal conversion material may be, for example, a dye or a pigment capable of absorbing infrared radiation or near-infrared radiation. Specific examples of the thermally-meltable heat sensitive layer include the heat sensitive layers disclosed in JP 11-221977 A, JP 2005-309126 A, and JP 2009-014946 A.

<Heat Sensitive Layer-2> Thermally-Expandable Heat Sensitive Layer

Specific examples of thermally-expandable heat sensitive layers include the heat sensitive layers containing air bubbles, which are disclosed in JP 2005-300586 A and JP 2005-331924 A; and the heat sensitive layers containing liquid bubbles, which are disclosed in WO 2010/113989 A1.

A directly imageable planographic printing plate precursor (which refers to a planographic printing plate precursor onto which an image from a manuscript can be directly written, using a laser beam) which includes a heat sensitive layer containing air bubbles or liquid bubbles and having a high sensitivity, can be developed simply by applying physical forth thereto, after the exposure. Therefore, in a step of exposing the directly imageable planographic printing plate precursor to produce a planographic printing plate, there are cases where a phenomenon referred to as "formation of blisters" may occur, in which the exposed portions of the silicone rubber layer float or swell to form blisters. When the "formation of blisters" occurs, the floated or swollen portions of the silicone rubber layer may be transferred to a conveyance roller in an exposure machine or an automatic developing machine, during the conveyance of the exposed directly imageable planographic printing plate precursor. The portions of the silicone rubber layer transferred to the conveyance roller will be re-transferred to the surface of the printing precursor to be processed subsequently, to cause exposure defects, development defects, and/or the like. The formation of blisters is more likely to occur when the directly imageable planographic printing plate precursor has a higher sensitivity, and as the light exposure is increased.

Specific examples of the thermally-expandable heat sensitive layer proposed for preventing the formation of blisters as described above, include: the heat sensitive layers containing non-photosensitive particles, which are disclosed in JP 2012-93728 A, JP 2012-133321 A, JP 2012-133322 A, WO 2012/043282 A1 and the like; and the heat sensitive layer containing at least a novolac resin, a polyurethane, and a photothermal conversion material, and having a phase-separated structure which includes at least a phase containing the novolac resin and a phase containing the polyurethane, which is disclosed in WO 2012/099003 A1.

<Heat Sensitive Layer-3> Thermally-Ablatable Heat Sensitive Layer

A thermally-ablatable heat sensitive layer is a type of heat sensitive layer which is thermally ablated by the irradiation of a near-infrared laser beam. A subsequent developing treatment removes, along with the ablated portions of the heat sensitive layer, the portions of silicone rubber layer present at the surface thereon, thereby forming the image area. Examples thereof include the heat sensitive layers disclosed in JP 7-314934, JP 9-086065 A, JP 9-131981 A, and U.S. Pat. No. 5,353,705.

<Heat Sensitive Layer-4> Thermally-Detachable Heat Sensitive Layer

A thermally-detachable heat sensitive layer is a layer used in the following image formation system:

an image formation system which uses a printing member including: a first layer; and a second layer adhered to the first layer; wherein the first layer and the second layer have different affinities for at least one printing liquid selected from the group consisting of inks and ink repellent liquids; and in which system the printing member is heated to allow the first layer to be irreversibly detached from the second layer in an imagewise pattern, without substantially ablating the second layer; or an image formation system which uses a printing member including: a first layer; a second layer adhered to the lower side of the first layer; and a third layer disposed to the lower side of the second layer; wherein the first layer and at least one of the other layers have different affinities for at least one printing liquid selected from the group consisting of inks and ink repellent liquids; and in which system, the printing member is heated to allow the first layer to be irreversibly detached from the second layer in an imagewise pattern, without ablating the second layer.

In the printing member used in the above described image formation system, the second layer on which a printing pattern is formed is the thermally-detachable heat sensitive layer. Examples thereof include the heat sensitive layer disclosed in U.S. Pat. No. 6,107,001.

<Heat Sensitive Layer-5> Thermosetting Heat Sensitive Layer

A thermosetting heat sensitive layer is a type of heat sensitive layer in which a cross-linked structure is formed by a thermally activated crosslinking agent due to heat generated by the irradiation of a near-infrared laser beam. After a developing treatment carried out subsequently, the portions of the silicone rubber layer irradiated with the laser beam remain, and the unirradiated portions of the silicone rubber layer are removed. The portions of the heat sensitive layer not irradiated with the laser beam remain after the development. Examples thereof include the thermosetting heat sensitive layers disclosed in JP 11-157236 A and JP 11-240271 A.

Next, the photosensitive layer will be described. Examples of the photosensitive layer preferably used in the present invention include the following photodecomposable photosensitive layers and photocurable photosensitive layers, but not limited thereto.

<Photosensitive Layer-1> Photodecomposable Photosensitive Layer

The photodecomposable photosensitive layer is a type of a photosensitive layer in which the solubility of its surface to a pre-treatment liquid is increased by the irradiation of UV light. After a developing treatment carried out subsequently, the portions of the silicone rubber layer irradiated with the UV light are removed, and the unirradiated portions of the silicone rubber layer remain. The exposed portions of the photosensitive layer remain after the development. Examples thereof include the photosensitive layers disclosed in JP 11-352672 A.

<Photosensitive Layer-2 Photocurable Photosensitive Layer>

The photocurable photosensitive layer is a type of a photosensitive layer in which the polymerization of an ethylenically unsaturated double bond-containing compound is initiated by radicals generated due to the irradiation of UV light. After a developing treatment carried out subsequently, the portions of the silicone rubber layer irradiated with the UV light remain, and the unirradiated portions of the silicone rubber layer are removed. The unexposed portions of the photosensitive layer remain after the development. Examples thereof include the photosensitive layers disclosed in JP 6-118629 A and JP 2007-233346 A.

The heat sensitive layer or the photosensitive layer preferably has a film mass of 0.5 $g/m^2$ or more, in terms of improving the printing durability and the heat sensitivity or photosensitivity of the planographic printing plate. At the same time, the film mass is preferably 7 $g/m^2$ or less, in terms of facilitating the volatilization of the diluting solvent and improving the productivity.

Further, the planographic printing plate precursor according to the present invention may include a heat insulating layer between the substrate and the silicone rubber layer, or between the substrate and the heat sensitive layer or the photosensitive layer, for the purpose of improving the adhesion, preventing halation, improving the plate inspectability, improving the heat insulation, improving the printing durability and the like. Examples of the heat insulating layer to be used in the present invention include the heat insulating layers disclosed in JP 2004-199016 A, JP 2004-334025 A, JP 2006-276385 A, and the like, but not limited thereto.

The heat insulating layer preferably has a film mass of 1 g/m² or more, in terms of improving the printing durability and the heat insulation of the resulting planographic printing plate. At the same time, the film mass is preferably 15 g/m² or less, in terms of facilitating the volatilization of the diluting solvent and improving the productivity. The film mass is more preferably within the range of from 2 to 10 g/m².

For the purpose of protecting the surface of the planographic printing plate precursor according to the present invention, either or both of a cover film and an interleaving paper may be provided on the precursor surface.

The cover film is preferably a film having a thickness of 100 μm or less and capable of effectively transmitting the wavelength of the light of the exposure light source. Specific examples include films of polyethylene, polypropylene, polyvinyl chloride, polyethylene terephthalate, and cellophane. Further, the cover film may include thereon any of various types of light absorbers, photobleachable materials and photochromic materials, such as those described in JP 2-063050 A, for the purpose of preventing the exposure of the printing precursor due to being exposed to light.

The interleaving paper preferably has a basis weight of from 30 to 120 g/m², and more preferably from 30 to 90 g/m². When the interleaving paper has a basis weight of 30 g/m² or more, a sufficient mechanical strength can be obtained. When the interleaving paper has a basis weight of 120 g/m² or less, on the other hand, it is advantageous not only in terms of economy, but also in terms of workability since the thickness of the resulting laminate of the planographic printing plate precursor and the paper is reduced. Examples of preferred interleaving papers include information recording paper 40 g/m² (manufactured by Nagoya Pulp K.K.), metal-containing interleaving paper 30 g/m² (manufactured by Nagoya Pulp K.K.), unbleached kraft paper 50 g/m² (manufactured by Chuetsu Pulp & Paper Co., Ltd.), NIP paper 52 g/m² (manufactured by Chuetsu Pulp & Paper Co., Ltd.), pure white roll paper 45 g/m² (manufactured by Oji Paper Co., Ltd.), and Clupak 73 g/m² (manufactured by Oji Paper Co., Ltd.), all of which are available from the respective companies. However, the interleaving paper is not limited to those mentioned above.

Next, the method of producing the planographic printing plate precursor will be described.

In cases where a heat insulating layer is provided on a substrate, a heat insulating layer composition or a solution thereof is coated on the substrate, followed by drying with or without heating, and curing, to form the heat insulating layer on the substrate.

The heat insulating layer composition or a solution thereof can be coated using a coating apparatus, such as slit die coater, a gravure coater, a roll coater, or a wire bar coater. However, a slit die coater is preferred.

Drying with heating can be carried using a hot air dryer, an infrared dryer, or the like, preferably at a temperature of from 50 to 250° C., for a period of from 30 seconds to 5 minutes.

A heat sensitive layer composition or a photosensitive layer composition, or a solution thereof, is coated on the substrate or the heat insulating layer, followed by drying with or without heating, and curing, to form a heat sensitive layer or a photosensitive layer on the substrate or the heat insulating layer.

The heat sensitive layer composition or the photosensitive layer composition, or a solution thereof, can be coated using a coating apparatus, such as slit die coater, a gravure coater, a roll coater, or a wire bar coater. However, a slit die coater is preferred.

Drying with heating can be carried using a hot air dryer, an infrared dryer, or the like, preferably at a temperature of from 50 to 150° C., for a period of from 30 seconds to 5 minutes.

In cases where a thin film of a metal or the like is used as the heat sensitive layer, the heat sensitive layer can be formed by changing the above described step to a step in which the heat sensitive layer composition is vapor-deposited or sputtered on the substrate, or on the substrate provided with the heat insulating layer.

Next, the silicone composition for use in a printing plate or a solution of the silicone composition for use in a printing plate is coated on the heat sensitive layer or the photosensitive layer, followed by drying with or without heating, and curing, to form a silicone rubber layer.

When coating the silicone composition for use in a printing plate or a solution of the silicone composition for use in a printing plate, it is preferred to remove water attached to the surface of the heat sensitive layer, as far as possible, in terms of improving the adhesion.

The silicone composition for use in a printing plate or a solution of the silicone composition for use in a printing plate can be coated using a coating apparatus, such as slit die coater, a gravure coater, a roll coater, or a wire bar coater. However, a slit die coater is preferred.

Drying with heating can be carried using a hot air dryer, an infrared dryer, or the like, preferably at a temperature of from 50 to 150° C., for a period of from 30 seconds to 5 minutes.

For the purpose of protecting the surface of the resulting planographic printing plate precursor, either or both of a cover film and an interleaving paper may be provided on the silicone rubber layer.

Next, the method of producing a planographic printing plate will be described. Examples of the method of producing a planographic printing plate include a method including at least a step of exposing the planographic printing plate precursor according to the present invention (exposure step), and a step of removing either the exposed portions or the unexposed portions of the silicone rubber layer (development step).

First, the exposure step will be described. Examples of the method of exposing the planographic printing plate precursor according to the present invention include: (1) a method in which an original film for positive or negative printing is brought into close contact with the surface of the planographic printing plate precursor, and then UV light is irradiated over the entire surface from the side of the original film; and (2) a method (computer to plate (CTP) method) in which a laser beam having a specific emission wavelength is used to directly write an image into a directly imageable planographic printing plate precursor, based on digital data, without using an original film. Examples of laser beam sources to be used in the CTP method include those having an emission wavelength within the range of from 350 to 1,500 nm.

Next, the development step will be described. The exposed planographic printing plate precursor is subjected to rubbing in the presence or absence of a liquid, to remove either the exposed portions or the unexposed portions of the silicone rubber layer. Examples of the method for carrying out a scrubbing treatment include: (i) a method in which, a pad for development, a brush, a dry cotton pad or the like is used to scrub the precursor surface, in the absence of a liquid; (ii) a method in which a nonwoven fabric, an absorbent cotton, a cloth, a sponge or the like impregnated with water, or with water to which a surfactant is added, is used to wipe off the precursor surface; (iii) a method in which the precursor surface is scrubbed with a rotatable brush, while bringing the precursor surface into contact with water, or water to which a surfactant is added; and (iv) a method in which water, warm water or water vapor under high pressure is injected to the precursor surface. The surfactant is preferably one whose aqueous solution has a pH of from 5 to 8. The content of the surfactant is preferably 10% by mass or less with respect to the amount of the aqueous solution. Such an aqueous solution is preferred, because of its high safety, and also in terms of economic efficiency such as the cost of disposal.

Before carrying out the development, a pre-treatment may be carried out in which the printing precursor is immersed in a pre-treatment liquid for certain period of time. The pre-treatment liquid may be, for example: water; water to which a polar solvent such as an alcohol, a ketone, an ester, or a carboxylic acid is added; a solvent composed of at least one of an aliphatic hydrocarbon, an aromatic hydrocarbon, and the like, to which a polar solvent is added; or a polar solvent. Among these, preferred is a pre-treatment liquid containing a glycol compound or a glycol ether compound as a main component. Further, an amine compound, the above described surfactant or the like may be added to the pre-treatment liquid.

Examples of the pre-treatment liquid include those disclosed in JP 63-179361 A, JP 4-163557 A, JP 4-343360 A, JP 9-34132 A, and WO 1997/017634. Specific examples of the pre-treatment liquid include PP-1, PP-3, PP-F, PP-FII, PTS-1, PH-7N, CP-1, NP-1, DP-1, and CP-Y (all of the above manufactured by Toray Industries, Inc.).

For the purpose of enhancing the visibility of the image area and the accuracy of measuring halftone dots, it is possible to add a dye such as Crystal Violet, Victoria Pure Blue, or Astrazon Red to the above described water, or water to which a surfactant is added, so that the dyeing of an ink accepting layer forming the image area can be carried out simultaneously with the development. Further, it is also possible to carry out the dyeing after the exposure, using a liquid to which any of the above described dyes is added.

A part or the entirety of the development step can be carried out automatically by an automatic developing machine. As the automatic developing machine, it is possible to use: an apparatus consisting of a development unit; an apparatus in which a pre-treatment unit and a development unit are provided in this order; an apparatus in which a pre-treatment unit, a development unit, and a post-treatment unit are provided in this order; an apparatus in which a pre-treatment unit, a development unit, a post-treatment unit, and a water-washing unit are provided in this order; or the like. Specific examples of such an automatic developing machine include TWL-650 series, TWL-860 series, and TWL-1160 series (all of the above manufactured by Toray Industries, Inc.); and the automatic developing machines disclosed in JP 4-2265 A, JP 5-2272 A, JP 5-6000 A, and the like. These automatic developing machines may be used in combination.

Alternatively, a planographic printing plate can be produced, for example, by another method in which the silicone composition for use in a printing plate or a solution of the silicone composition for use in a printing plate is directly patterned on a substrate or on another layer provided on the substrate by an ink-jet method or the like, followed by drying with or without heating, and curing, to form a silicone rubber layer. In the case of drying with heating, the drying is preferably carried out using a hot air dryer, an infrared dryer or the like, at a temperature of from 50 to 150° C. for a period of from 30 seconds to 5 minutes.

In cases where the resulting planographic printing plates are stacked for storage, it is preferred that interleaving papers be placed between the respective printing plates, in order to protect the plate surface.

Next, a description will be given regarding the method of producing a printed matter, using the planographic printing plate and an ink. The planographic printing plate according to the present invention can be suitably used in a waterless printing in which printing is carried out using only an ink, without using dampening water.

The method of producing a printed matter includes a step of allowing an ink to adhere to the surface of the planographic printing plate including at least the silicone rubber layer, and a step of transferring the ink to a medium to be printed directly or via a blanket.

One embodiment of the method of producing a printed matter according to the present invention will be described with reference to FIG. 1. Although an example in which a blanket cylinder 4 is used will be described below, the present invention is not limited thereto, and it is also possible to allow an ink to adhere directly from an ink roller 1 to a planographic printing plate 2 attached to a plate cylinder 3, without using the blanket cylinder 4, followed by directly transferring the ink to a medium to be printed. Further, although the following description describes an example in which an ink is supplied from above a medium to be printed 5, the ink may also be supplied from below the medium to be printed 5.

First, an ink is supplied to the ink roller 1. The ink supplied to the ink roller 1 adheres to the planographic printing plate 2 attached to the plate cylinder 3, at the contact point with the plate cylinder 3. The ink adhered to the planographic printing plate 2 is transferred to the surface of the blanket cylinder 4, at the contact point with the blanket cylinder 4. The ink adhered to the blanket cylinder 4 is then transferred to the medium to be printed 5 disposed on an impression cylinder 6, at the contact point with the medium to be printed 5. The medium to be printed 5 is dried as necessary, to obtain a printed matter. The rotational speeds of the ink roller and the respective cylinders are not particularly limited, and can be selected as appropriate depending on the quality required for the resulting printed matter, the time of delivery, and the properties of the ink.

The printing machine to be used in the production of a printed matter may be, for example, a generally known direct printing machine or offset printing machine, such as one with a sheet-feeding system or a rotary press system. However, an offset printing machine is preferred, since damage to the planographic printing plate during the printing can be reduced to allow for producing a larger amount of printed matter. The offset printing machine includes a feeder unit, a printing unit, and a delivery unit. The printing unit includes at least an ink supply portion, a plate cylinder, a blanket cylinder, and an impression cylinder.

The offset printing machine is preferably one in which a cooling mechanism is provided to an oscillating roller and/or a plate cylinder thereof, in terms of improving the scumming resistance.

Examples of the medium to be printed include thin papers, thick papers, films, labels, and metal plates/films, but not limited thereto.

When printing is carried out using an oil-based ink, a water-soluble ink, or an aqueous ink, the ink transferred to the medium to be printed is dried naturally or dried by a heating treatment, and/or cured, to obtain a printed matter. When printing is carried out using a UV ink, the ink transferred to the medium to be printed is instantly cured by UV light irradiated by a UV light irradiation apparatus, to obtain a printed matter.

Examples of the ink preferably used in the present invention include the following inks, but not limited thereto.

<Ink-1> Oil-Based Ink

Examples of the oil-based ink include known oxidative polymerization-type oil-based inks disclosed in JP 48-004107 A, JP 01-306482 A, and the like. Further, also included in the category of the oil-based ink are: soybean oil inks and vegetable oil inks obtained by replacing the mineral oil (petroleum) components contained in conventional oil-based inks, as solvent components, with vegetable oil components; and inks with a low environmental load, referred to as Non-VOC inks or the like; which are disclosed in JP 2005-336301 A, JP 2005-126579 A, JP 2011-144295 A, JP 2012-224823 A, and the like.

<Ink-2> UV Ink

Examples of the UV ink include known UV curable inks disclosed in JP 5158274 B, JP 2012-211230 A, and the like. Also included in the category of the UV ink are high-sensitivity UV inks used for power-saving (reduced light) UV printing and LED-UV printing.

<Ink-3> Water-Soluble Ink

Examples of the water-soluble ink include known water-soluble inks which can be washed off with water or an aqueous washing liquid, disclosed in JP 2009-57461 A, JP 4522094 B, and the like.

<Ink-4> Aqueous Ink

Examples of the aqueous ink include known aqueous inks containing water, disclosed in JP 2007-177191 A, JP 2009-13344 A, JP 2009-13345 A, JP 2010-59332 A, JP 2010-59333 A, and the like.

EXAMPLES

The present invention will now be described in further detail, with reference to Examples. Evaluations in the respective Examples and Comparative Examples were carried out by the following methods.

<Evaluation Methods in Respective Examples and Comparative Examples>

(1) Evaluation of Adhesion Between Silicone Rubber Layer and Heat Sensitive Layer The reproducibility of halftone dots in the shadow region, which serves as an index for evaluating the adhesion between the silicone rubber layer and the heat sensitive layer, is evaluated according to the following method.

A planographic printing plate precursor was set in a laser exposure machine: "PlateRite" 8800E (manufactured by SCREEN Graphic Solutions Co., Ltd.), and an image (AM 175 lines (2,400 dpi)) formed by shadow halftone dots having a halftone dot area ratio of from 70.0 to 99.5% (in 0.5% increments) was exposed at a light exposure of 125 mJ/cm$^2$, and then developed under the following development conditions.

<Development Conditions>

Automatic developing machine: TWL-1160FII (manufactured by Toray Industries, Inc.)
Pre-treatment liquid: CP-Y (manufactured by Toray Industries, Inc., liquid temperature: 45° C.)
Developer: tap water (liquid temperature: 30° C.)
Post-treatment liquid: PA-1 (manufactured by Toray Industries, Inc., liquid temperature: 30° C.)
Water-washing: tap water (liquid temperature: 30° C.)
Development speed: 80 cm/min In the resulting planographic printing plate, the reproducibility of the respective halftone dot area ratios was observed by a light microscope (objective lens: 10 to 50-fold magnification, eyepiece lens: 10-fold magnification), and a halftone dot area ratio which had achieved a reproducibility of 90 percent or more was defined as the shadow halftone dot reproducibility.

(2) Evaluation of Ink Repellency

The planographic printing plate obtained in the above described evaluation (1) is set in a printing machine: "OLIVER" 466SD ((manufactured by Sakurai Graphic Systems Corporation), and printing was carried out under the following printing conditions, and using various types of inks.

<Printing Conditions>

Ink roller: Trust Zeta (manufactured by Techno Roll Co., Ltd.)
Blanket:
For printing with an oil-based ink or a water-soluble ink: EX6200 (manufactured by Kinyosha Co., Ltd.)
For printing with a UV ink or an aqueous ink: MC1300 (manufactured by Kinyosha Co., Ltd.)
Plate surface temperature: 28° C.
Printing speed: 8,000 sheets/hr
:OK "Topcoat" (registered trademark)+(manufactured by Oji Paper Co., Ltd.)

<Inks>

Oil-based ink: Aqualess Ecoo Neo HG Black (manufactured by Toyo Ink Co., ltd.)
Water-soluble ink: DRY-O-COLOR Naturalis 100W2 Black (manufactured by DIC Graphics Corporation)
UV ink: UV 171CT Black M-TW (manufactured by T&K TOKA Corporation)
Aqueous ink: an aqueous ink obtained by stirring and mixing the following components at room temperature for 5 hours: 18 parts by mass of carbon black (color index: PBK7) as a pigment, 30 parts by mass of styrene.acrylic acid.ethylcarbitol acrylate copolymer resin (acid value: 120; weight average molecular weight: about 22,000), 47 parts by mass of ion exchanged water, 0.1 parts by mass of Aqualen 8021N (manufactured by Kyoeisha Chemical Co. Ltd.), and 4.9 parts by mass of tripropylene glycol monobutyl ether.

The degree of scumming in the non-image area of the resulting printed matter was evaluated by visual observation. In cases where no scumming was observed, the printing speed was reduced to 6,000 sheets/hr and printing was carried out again, and the degree of scumming was evaluated by visual observation. When no scumming was observed even at a printing speed of 6,000 sheets/hr, the printing speed was further reduced to 4,000 sheets/hr and printing was carried out again, and the degree of scumming was evaluated by visual observation. The evaluation was carried out according to the following standards:

excellent: no scumming is observed at a printing speed of 4,000 sheets/hr
good: no scumming is observed at a printing speed of 6,000 sheets/hr
fair: no scumming is observed at a printing speed of 8,000 sheets/hr
bad: scumming is observed at the gripping portion, at a printing speed of 8,000 sheets/hr
worse: scumming is observed over the entire surface, at a printing speed of 8,000 sheets/hr (3) Evaluation of Scratch Resistance An unexposed planographic printing plate precursor was developed under the same development conditions as the above (1). The developed planographic printing plate (6 cm×6 cm) was set to a continuous-loading type rubbing fastness tester, and subjected to abrasion for 150 round trips at a load of 100 g, using a pad of a raised fabric: "Caperon" NS5100 (manufactured by Kanbo Create Co., Ltd.) cut into a size of 2 cm×3 cm and having a hair length of about 5 mm. The planographic printing plate which had been subjected to abrasion was pasted on an aluminum plate having a thickness of 0.15 mm, and set in "OLIVER" 466SD. Then printing was carried out under the following conditions.
<Printing Conditions>
Ink Roller: Trust Zeta
Blanket: MC1300
Plate surface temperature: 28° C.
Printing speed: 8,000 sheets/hr
Medium to be printed: OK "Topcoat" (registered trademark)+
Ink: UV 171CT Black M-TW The printed matter was visually observed, and the scratch resistance was evaluated according to the following standards:
excellent: no scratch is found
good: shallow scratches are faintly observed
bad: shallow scratches are observed over the entire surface
worse: deep scratches are observed over the entire surface Example 1

On a degreased aluminum substrate (manufactured by Mitsubishi Aluminum Co., Ltd.) having a thickness of 0.24 mm, the following solution of a heat insulating layer composition was coated, followed by drying at 200° C. for 90 seconds, to prepare a heat insulating layer having a film mass of 10 g/m$^2$.
<Solution of Heat Insulating Layer Composition>

The following component (a) was charged into a container, and then the components (b), (c), (d) and (e) were added thereto slowly and sequentially, while stirring with a three-one motor. The resultant was further stirred until the components were mixed homogeneously. Into the resulting mixed liquid, components (f) and (g) were added, followed by stirring and mixing for 10 minutes, to obtain the solution of the heat insulating layer composition.
(a) Titanium oxide dispersion: A dispersion of "Tipaque" (registered trademark) CR-50 (manufactured by Ishihara Sangyo Co., Ltd.) in N,N-dimethylformamide (titanium oxide: 50% by mass): 60 parts by mass
(b) Epoxy resin: "JER" (registered trademark) 1010 (manufactured by Mitsubishi Chemical Corporation): 35 parts by mass
(c) Polyurethane: "Sanprene" (registered trademark) LQ-T1331D (manufactured by Sanyo Chemical Industries, Ltd.; solid concentration: 20% by mass): 375 parts by mass
(d) N,N-dimethylformamide: 730 parts by mass
(e) Methyl ethyl ketone: 250 parts by mass
(f) Aluminum chelate: "Alumichelate" ALCH-TR (manufactured by Kawaken Fine Chemicals Co., Ltd.): 10 parts by mass
(g) Leveling agent: "Disparlon" (registered trademark) LC951 (manufactured by Kusumoto Chemical Co., Ltd.; solid concentration: 10% by mass): 1 parts by mass
<Preparation of Titanium Oxide Dispersion>

Into a sealable glass standard bottle filled with 1,600.0 g of Zirconia beads: "YTZ" (registered trademark) balls (diameter: 1 mm; manufactured by Nikkato Corporation), 700.0 g of N,N-dimethylformamide, 37.5 g of "JER" (registered trademark) 1010 (manufactured by Mitsubishi Chemical Corporation), and 262.5.0 g of "Tipaque" (registered trademark) CR-50 (manufactured by Ishihara Sangyo Co., Ltd.) were charged. After sealing the bottle, the bottle was set on a small-size ball-mill rotator (manufactured by AS ONE Corporation), and dispersed at a rotational speed of 0.4 m/sec for 7 days, to obtain a titanium oxide dispersion.

Subsequently, the following solution of a heat sensitive layer composition was coated on the heat insulating layer, followed by heating at 140° C. for 90 seconds, to form a heat sensitive layer having a film mass of 1.4 g/m$^2$. The solution of the heat sensitive layer composition was obtained by stirring and mixing the following components at room temperature.
<Solution of Heat Sensitive Layer Composition>
(a) Phenol formaldehyde novolac resin: "Sumilite Resin" (registered trademark) PR53195 (manufactured by Sumitomo Bakelite Co., Ltd.): 45.0 parts by mass
(b) Polyurethane solution: "Nippolan" (registered trademark) 5196 (manufactured by Nippon Polyurethane Industry Co., Ltd.; solid concentration: 30% by mass): 62.5 parts by mass
(c) Infrared absorbing dye: "PROJET" 825LD1 (manufactured by Nitto Denko Avecia Inc.): 12.0 parts by mass
(d) Titanium di-n-butoxy-bis(acetylacetonate) solution: "N acem" (registered trademark) titanium (manufactured by Nippon Kagaku Sangyo Co., Ltd.); solid concentration: 73% by mass): 28.5 parts by mass
(e) A reaction product of polyoxypropylene diamine/glycidyl methacrylate/3-glycidoxypropyltrimethoxysilane=1/3/1 mol (solid concentration: 50% by mass): 22.5 parts by mass
(f) Tetrahydrofuran: 717.0 parts by mass
(g) Ethanol: 112.5 parts by mass Subsequently, the following solution of a silicone composition-1 for use in a printing plate was coated on the heat sensitive layer, followed by heating at 140° C. for 80 seconds, to form a silicone rubber layer having a film mass of 2.0 g/m$^2$.
<Solution of Silicone Composition-1 for Use in Printing Plate>

The following components (a) and (b) were charged into a container, followed by stirring until the components were mixed homogeneously. The resulting solution was bubbled with dry nitrogen for 20 minutes to remove water contained in the solution. To the resulting solution, the components (c), (d) and (e) were added, followed by stirring and mixing for 10 minutes. The component (f) was then added to the resultant, followed by stirring and mixing for another 10 minutes. Immediately before the coating, the component (g) was added to the resultant, followed by stirring and mixing to obtain the solution of the silicone composition-1 for use in a printing plate.
(a) Isoparaffin solvent: "Isopar" (registered trademark) E (manufactured by Exxon Mobil Corporation): 894.05 parts by mass
(b) Vinyl group-containing silicone compound (both end dimethylvinylsiloxy-terminated polydimethylsiloxane): "DMS"-V35 (manufactured by GELEST, Inc.; weight average molecular weight: 49,500; number of vinyl groups in the molecule: 2): 93.39 parts by mass
(c) SiH group-containing compound (both end trimethylsiloxy-terminated methylhydrosiloxane-dimethylsiloxane copolymer): "HMS"-301 (manufactured by GELEST, Inc.; weight average molecular weight: 1,960; SiH group equivalent: 245; number of SiH groups in the molecule: 8): 2.56 parts by mass (d) Compound represented by the general formula (I): vinyltriacetoxysilane: 0.74 parts by mass
(e) Compound represented by the general formula (II): methyltriacetoxysilane: 3.26 parts by mass
(f) Reaction inhibitor: γ-picoline: 1.00 parts by mass
(g) Reaction catalyst (platinum mixture): XC94-C4326 (manufactured by Momentive Performance Materials Japan LLC; solid concentration: 1% by mass): 5.00 parts by mass The ratio of the number of SiH groups to the number of vinyl groups (the number of SiH groups/the number of vinyl groups) in the silicone rubber layer was 1.5.

Example 2

The production of a planographic printing plate precursor, the production of a printing plate using the precursor, and the evaluations thereof were carried out in the same manner as in Example 1, except for using the following solution of a silicone composition-2 for use in a printing plate, instead of the solution of the silicone composition-1 for use in a printing plate.

<Solution of Silicone Composition-2 for Use in a Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltriacetoxysilane: 0.74 parts by mass
(e) Compound represented by the general formula (II): ethyltriacetoxysilane: 3.26 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 3

The production of a planographic printing plate precursor, the production of a printing plate using the precursor, and the evaluations thereof were carried out in the same manner as in Example 1, except for using the following solution of a silicone composition-3 for use in a printing plate, instead of the solution of the silicone composition-1 for use in a printing plate.

<Solution of Silicone Composition-3 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltriacetoxysilane: 0.74 parts by mass
(e) Compound represented by the general formula (II): phenyltriacetoxysilane: 3.26 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 4

The production of a planographic printing plate precursor, the production of a printing plate using the precursor, and the evaluations thereof were carried out in the same manner as in Example 1, except for using the following solution of a silicone composition-4 for use in a printing plate, instead of the solution of the silicone composition-1 for use in a printing plate.

<Solution of Silicone Composition-4 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltriacetoxysilane: 0.74 parts by mass
(e) Compound represented by the general formula (II): methyltris(methylethylketoximino)silane: 3.26 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 5

The production of a planographic printing plate precursor, the production of a printing plate using the precursor, and the evaluations thereof were carried out in the same manner as in Example 1, except for using the following solution of a silicone composition-5 for use in a printing plate, instead of the solution of the silicone composition-1 for use in a printing plate.

<Solution of Silicone Composition-5 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltriacetoxysilane: 0.74 parts by mass
(e) Compound represented by the general formula (II): phenyltris(methylethylketoximino)silane: 3.26 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 6

The production of a planographic printing plate precursor, the production of a printing plate using the precursor, and the evaluations thereof were carried out in the same manner as in Example 1, except for using the following solution of a silicone composition-6 for use in a printing plate, instead of the solution of the silicone composition-1 for use in a printing plate.

<Solution of Silicone Composition-6 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Compound represented by the general formula (I): vinyltris(methylethylketoximino)silane: 1.00 parts by mass
(e) Methyltriacetoxysilane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 7

The production of a planographic printing plate precursor, the production of a printing plate using the precursor, and the evaluations thereof were carried out in the same manner as in Example 1, except for using the following solution of a silicone composition-7 for use in a printing plate, instead of the solution of the silicone composition-1 for use in a printing plate.

<Solution of Silicone Composition-7 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltris(methylethylketoximino)silane: 1.00 parts by mass
(e) Ethyltriacetoxysilane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 8

The production of a planographic printing plate precursor, the production of a printing plate using the precursor, and the evaluations thereof were carried out in the same manner as in Example 1, except for using the following solution of a silicone composition-8 for use in a printing plate, instead of the solution of the silicone composition-1 for use in a printing plate.

<Solution of Silicone Composition-8 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltris(methylethylketoximino)silane: 1.00 parts by mass
(e) Phenyltriacetoxysilane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 9

The production of a planographic printing plate precursor, the production of a printing plate using the precursor, and the evaluations thereof were carried out in the same manner as in Example 1, except for using the following solution of a silicone composition-9 for use in a printing plate, instead of the solution of the silicone composition-1 for use in a printing plate.

<Solution of Silicone Composition-9 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltris(methylethylketoximino)silane: 1.00 parts by mass
(e) Methyltris(methylethylketoximino)silane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 10

The production of a planographic printing plate precursor, the production of a printing plate using the precursor, and the evaluations thereof were carried out in the same manner as in Example 1, except for using the following solution of a silicone composition-10 for use in a printing plate, instead of the solution of the silicone composition-1 for use in a printing plate.

<Solution of Silicone Composition-10 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltris(methylethylketoximino)silane: 1.00 parts by mass
(e) Phenyltris(methylethylketoximino)silane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 11

The production of a planographic printing plate precursor, the production of a printing plate using the precursor, and the evaluations thereof were carried out in the same manner as in Example 1, except for using the following solution of a silicone composition-11 for use in a printing plate, instead of the solution of the silicone composition-1 for use in a printing plate.

<Solution of Silicone Composition-11 for Use in Printing Plate>
(a) "Isopar" (registered trademark) E: 894.05 parts by mass
(b) "DMS"-V35: 93.97 parts by mass
(c) "HMS"-301: 1.98 parts by mass
(d) Vinyltris(methylethylketoximino)silane: 0.50 parts by mass
(e) Phenyltris(methylethylketoximino)silane: 3.50 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 12

The production of a planographic printing plate precursor, the production of a printing plate using the precursor, and the evaluations thereof were carried out in the same manner as in Example 1, except for using the following solution of a silicone composition-12 for use in a printing plate, instead of the solution of the silicone composition-1 for use in a printing plate.

<Solution of Silicone Composition-12 for Use in Printing Plate>
(a) "Isopar" (registered trademark) E: 894.05 parts by mass
(b) "DMS"-V35: 92.81 parts by mass
(c) "HMS"-301: 3.14 parts by mass
(d) Vinyltris(methylethylketoximino)silane: 1.50 parts by mass
(e) Phenyltris(methylethylketoximino)silane: 2.50 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 13

The production of a planographic printing plate precursor, the production of a printing plate using the precursor, and the evaluations thereof were carried out in the same manner as in Example 1, except for using the following solution of a silicone composition-13 for use in a printing plate, instead of the solution of the silicone composition-1 for use in a printing plate.

<Solution of Silicone Composition-13 for Use in Printing Plate>
(a) "Isopar" (registered trademark) E: 894.05 parts by mass
(b) "DMS"-V35: 91.66 parts by mass
(c) "HMS"-301: 4.29 parts by mass
(d) Vinyltris(methylethylketoximino)silane: 2.50 parts by mass
(e) Phenyltris(methylethylketoximino)silane: 1.50 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 14

The production of a planographic printing plate precursor, the production of a printing plate using the precursor, and the evaluations thereof were carried out in the same manner as in Example 1, except for using the following solution of a silicone composition-14 for use in a printing plate, instead of the solution of the silicone composition-1 for use in a printing plate.

<Solution of Silicone Composition-14 for Use in Printing Plate>
(a) "Isopar" (registered trademark) E: 894.05 parts by mass
(b) "DMS"-V35: 90.50 parts by mass
(c) "HMS"-301: 5.45 parts by mass
(d) Vinyltris(methylethylketoximino)silane: 3.50 parts by mass
(e) Phenyltris(methylethylketoximino)silane: 0.50 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 15

The production of a planographic printing plate precursor, the production of a printing plate using the precursor, and the evaluations thereof were carried out in the same manner as in Example 1, except for using the following solution of a silicone composition-15 for use in a printing plate, instead of the solution of the silicone composition-1 for use in a printing plate.

<Solution of Silicone Composition-15 for Use in Printing Plate>
(a) "Isopar" (registered trademark) E: 894.05 parts by mass
(b) "DMS"-V35: 95.36 parts by mass
(c) "HMS"-301: 2.59 parts by mass
(d) Vinyltris(methylethylketoximino)silane: 1.00 parts by mass
(e) Phenyltris(methylethylketoximino)silane: 1.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 16

The production of a planographic printing plate precursor, the production of a printing plate using the precursor, and the evaluations thereof were carried out in the same manner as in Example 1, except for using the following solution of a silicone composition-16 for use in a printing plate, instead of the solution of the silicone composition-1 for use in a printing plate.

<Solution of Silicone Composition-16 for Use in Printing Plate>
(a) "Isopar" (registered trademark) E: 894.05 parts by mass
(b) "DMS"-V35: 94.38 parts by mass
(c) "HMS"-301: 2.57 parts by mass
(d) Vinyltris(methylethylketoximino)silane: 1.00 parts by mass
(e) Phenyltris(methylethylketoximino)silane: 2.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 17

The production of a planographic printing plate precursor, the production of a printing plate using the precursor, and the evaluations thereof were carried out in the same manner as in Example 1, except for using the following solution of a silicone composition-17 for use in a printing plate, instead of the solution of the silicone composition-1 for use in a printing plate.

<Solution of Silicone Composition-17 for Use in Printing Plate>
(a) "Isopar" (registered trademark) E: 894.05 parts by mass
(b) "DMS"-V35: 92.40 parts by mass
(c) "HMS"-301: 2.55 parts by mass
(d) Vinyltris(methylethylketoximino)silane: 1.00 parts by mass
(e) Phenyltris(methylethylketoximino)silane: 4.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 18

The production of a planographic printing plate precursor, the production of a printing plate using the precursor, and the evaluations thereof were carried out in the same manner as in Example 1, except for using the following solution of a silicone composition-18 for use in a printing plate, instead of the solution of the silicone composition-1 for use in a printing plate.

<Solution of Silicone Composition-18 for Use in Printing Plate>
(a) "Isopar" (registered trademark) E: 894.05 parts by mass
(b) "DMS"-V35: 91.42 parts by mass
(c) "HMS"-301: 2.53 parts by mass (d) Vinyltris(methylethylketoximino)silane: 1.00 parts by mass
(e) Phenyltris(methylethylketoximino)silane: 5.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 19

The production of a planographic printing plate precursor, the production of a printing plate using the precursor, and the evaluations thereof were carried out in the same manner as in Example 1, except for using the following solution of a silicone composition-19 for use in a printing plate, instead of the solution of the silicone composition-1 for use in a printing plate.
<Solution of Silicone Composition-19 for Use in Printing Plate>
(a) "Isopar" (registered trademark) E: 894.05 parts by mass
(b) "DMS"-V35: 94.24 parts by mass
(c) "HMS"-301: 1.71 parts by mass
(d) Vinyltris(methylethylketoximino)silane: 1.00 parts by mass
(e) Phenyltris(methylethylketoximino)silane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.0.

Example 20

The production of a planographic printing plate precursor, the production of a printing plate using the precursor, and the evaluations thereof were carried out in the same manner as in Example 1, except for using the following solution of a silicone composition-20 for use in a printing plate, instead of the solution of the silicone composition-1 for use in a printing plate.
<Solution of Silicone Composition-20 for Use in Printing Plate>
(a) "Isopar" (registered trademark) E: 894.05 parts by mass
(b) "DMS"-V35: 92.55 parts by mass
(c) "HMS"-301: 3.40 parts by mass
(d) Vinyltris(methylethylketoximino)silane: 1.00 parts by mass
(e) Phenyltris(methylethylketoximino)silane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 2.0.

Example 21

The production of a planographic printing plate precursor, the production of a printing plate using the precursor, and the evaluations thereof were carried out in the same manner as in Example 1, except for using the following solution of a silicone composition-21 for use in a printing plate, instead of the solution of the silicone composition-1 for use in a printing plate.

<Solution of Silicone Composition-21 for Use in Printing Plate>
(a) "Isopar" (registered trademark) E: 894.05 parts by mass
(b) "DMS"-V35: 90.91 parts by mass
(c) "HMS"-301: 5.04 parts by mass
(d) Vinyltris(methylethylketoximino)silane: 1.00 parts by mass
(e) Phenyltris(methylethylketoximino)silane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 3.0.

Example 22

The production of a planographic printing plate precursor, the production of a printing plate using the precursor, and the evaluations thereof were carried out in the same manner as in Example 1, except for using the following solution of a silicone composition-22 for use in a printing plate, instead of the solution of the silicone composition-1 for use in a printing plate.
<Solution of Silicone Composition-22 for Use in Printing Plate>

The following components (a), (b), and (c) were charged into a container, followed by stirring until the components were mixed homogeneously. The resulting solution was bubbled with dry nitrogen for 20 minutes to remove water contained in the solution. To the resulting solution, the components (d), (e), and (f) were added, followed by stirring and mixing for 10 minutes. The component (g) was then added to the resultant, followed by stirring and mixing for another 10 minutes. Immediately before the coating, the component (h) was added to the resultant, followed by stirring and mixing to obtain the solution of the silicone composition-22 for use in a printing plate.
(a) "Isopar" (registered trademark) E: 894.05 parts by mass
(b) "DMS"-V35: 83.54 parts by mass
(c) A liquid having a surface tension at 25° C. of 30 mN/m or less (both end trimethylsiloxy-terminated polydimethylsiloxane): KF-96-50cs (manufactured by Shin-Etsu Chemical Co., Ltd.; viscosity average molecular weight: 3,780; surface tension at 25° C.: 20.8 mN/m; boiling point: >150° C.): 10.00 parts by mass
(d) "HMS"-301: 2.41 parts by mass
(e) Vinyltris(methylethylketoximino)silane: 1.00 parts by mass
(f) Phenyltris(methylethylketoximino)silane: 3.00 parts by mass
(g) γ-picoline: 1.00 parts by mass
(h) XC94-C4326: 5.00 parts by mass The ratio of the number of SiH groups to the number of vinyl groups (the number of SiH groups/the number of vinyl groups) in the silicone rubber layer was 1.5.

Example 23

The production of a planographic printing plate precursor, the production of a printing plate using the precursor, and the evaluations thereof were carried out in the same manner as in Example 22, except for using the following solution of a silicone composition-23 for use in a printing plate, instead of the solution of the silicone composition-22 for use in a printing plate.

<Solution of Silicone Composition-23 for Use in Printing Plate>
(a) "Isopar" (registered trademark) E: 894.05 parts by mass
(b) "DMS"-V35: 73.68 parts by mass
(c) KF-96-50cs: 20.00 parts by mass
(d) "HMS"-301: 2.27 parts by mass
(e) Vinyltris(methylethylketoximino)silane: 1.00 parts by mass
(f) Phenyltris(methylethylketoximino)silane: 3.00 parts by mass
(g) γ-picoline: 1.00 parts by mass
(h) XC94-C4326: 5.00 parts by mass The ratio of the number of SiH groups to the number of vinyl groups (the number of SiH groups/the number of vinyl groups) in the silicone rubber layer was 1.5.

Example 24

The production of a planographic printing plate precursor, the production of a printing plate using the precursor, and the evaluations thereof were carried out in the same manner as in Example 10, except that the film mass of the silicone rubber layer in Example 10 was changed to 1.6 g/m².

Example 25

The production of a planographic printing plate precursor, the production of a printing plate using the precursor, and the evaluations thereof were carried out in the same manner as in Example 1, except for using the following solution of a silicone composition-24 for use in a printing plate, instead of the solution of the silicone composition-1 for use in a printing plate.
<Solution of Silicone Composition-24 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltris(methylethylketoximino)silane: 1.00 parts by mass
(e) Compound represented by the general formula (III): tetrakis(methylethylketoximino)silane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Example 26

The production of a planographic printing plate precursor, the production of a printing plate using the precursor, and the evaluations thereof were carried out in the same manner as in Example 1, except for using the following solution of a silicone composition-25 for use in a printing plate, instead of the solution of the silicone composition-1 for use in a printing plate.

The following components (a) and (b) were charged into a container, followed by stirring until the components were mixed homogeneously. The resulting solution was bubbled with dry nitrogen for 20 minutes to remove water contained in the solution. To the resulting solution, the components (c), (d), (e), and (f) were added, followed by stirring and mixing for 10 minutes. The component (g) was then added to the resultant, followed by stirring and mixing for another 10 minutes. Immediately before the coating, the component (h) was added to the resultant, followed by stirring and mixing to obtain the solution of the silicone composition-25 for use in a printing plate.
<Solution of Silicone Composition-25 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltris(methylethylketoximino)silane: 1.00 parts by mass
(e) Phenyltris(methylethylketoximino)silane: 1.50 parts by mass
(f) Tetrakis(methylethylketoximino)silane: 1.50 parts by mass
(g) γ-picoline: 1.00 parts by mass
(h) XC94-C4326: 5.00 parts by mass The ratio of the number of SiH groups to the number of vinyl groups (the number of SiH groups/the number of vinyl groups) in the silicone rubber layer was 1.5.

Example 27

The production of a planographic printing plate precursor, the production of a printing plate using the precursor, and the evaluations thereof were carried out in the same manner as in Example 23, except for using the following solution of a silicone composition-26 for use in a printing plate, instead of the solution of the silicone composition-23 for use in a printing plate.
<Solution of Silicone Composition-26 for Use in Printing Plate>
(a) "Isopar" (registered trademark) E: 894.05 parts by mass
(b) Vinyl group-containing silicone compound (both end dimethylvinylsiloxy-terminated polydimethylsiloxane): "DMS"-V46 (manufactured by GELEST, Inc.; weight average molecular weight: 117,000; number of vinyl groups in the molecule: 2): 72.15 parts by mass
(c) KF-96-50cs: 20.00 parts by mass
(d) "HMS"-301: 2.80 parts by mass
(e) Vinyltris(methylethylketoximino)silane: 2.00 parts by mass
(f) Phenyltris(methylethylketoximino)silane: 3.00 parts by mass
(g) γ-picoline: 1.00 parts by mass
(h) XC94-C4326: 5.00 parts by mass The ratio of the number of SiH groups to the number of vinyl groups (the number of groups/the number of vinyl groups) in the silicone rubber layer was 1.5.

Example 28

The production of a planographic printing plate precursor, the production of a printing plate using the precursor, and the evaluations thereof were carried out in the same manner as in Example 27, except for using the following solution of a silicone composition-27 for use in a printing plate, instead of the solution of the silicone composition-26 for use in a printing plate.

The following components (a), (b), (c), and (d) were charged into a container, followed by stirring until the components were mixed homogeneously. The resulting solution was bubbled with dry nitrogen for 20 minutes to remove water contained in the solution. To the resulting solution, the component (e) was added, followed by stirring and mixing for 30 minutes. The components (f) and (g) were then added to the resultant, followed by stirring and mixing for another 10 minutes. Immediately before the coating, the component (h) was added to the resultant, followed by stirring and mixing to obtain the solution of the silicone composition-27 for use in a printing plate.

<Solution of Silicone Composition-27 for Use in Printing Plate>
(a) "Isopar" (registered trademark) E: 894.05 parts by mass
(b) Silanol group-containing silicone compound (both end silanol-terminated polydimethylsiloxane): "DMS"-S45 (manufactured by GELEST, Inc., weight average molecular weight: 110,000, number of silanol groups in the molecule: 2): 72.61 parts by mass
(c) KF-96-50cs: 20.00 parts by mass
(d) "HMS"-301: 2.34 parts by mass
(e) Vinyltris(methylethylketoximino)silane: 2.00 parts by mass
(f) Phenyltris(methylethylketoximino)silane: 3.00 parts by mass
(g) γ-picoline: 1.00 parts by mass
(h) XC94-C4326: 5.00 parts by mass The ratio of the number of SiH groups to the number of vinyl groups (the number of SiH groups/the number of vinyl groups) in the silicone rubber layer was 1.5.

Reference Example

The production of a planographic printing plate precursor, the production of a printing plate using the precursor, and the evaluations thereof were carried out in the same manner as in Example 1, except for using the following solution of a silicone composition-28 for use in a printing plate, instead of the solution of the silicone composition-1 for use in a printing plate.

<Solution of Silicone Composition-28 for Use in Printing Plate>
(a) "Isopar" (registered trademark) E: 894.05 parts by mass
(b) "DMS"-V35: 95.09 parts by mass
(c) "HMS"-301: 0.86 parts by mass
(d) Vinyltris(methylethylketoximino)silane: 1.00 parts by mass
(e) Phenyltris(methylethylketoximino)silane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 0.5.

Comparative Example 1

The production of a planographic printing plate precursor, the production of a printing plate using the precursor, and the evaluations thereof were carried out in the same manner as in Example 1, except for using the following solution of a silicone composition-29 for use in a printing plate, instead of the solution of the silicone composition-1 for use in a printing plate.

<Solution of Silicone Composition-29 for Use in Printing Plate>

The following components (a) and (b) were charged into a container, followed by stirring until the components were mixed homogeneously. The resulting solution was bubbled with dry nitrogen for 20 minutes to remove water contained in the solution. To the resulting solution, the components (c) and (d) were added, followed by stirring and mixing for 10 minutes. The component (e) was then added to the resultant, followed by stirring and mixing for another 10 minutes. Immediately before the coating, the component (f) was added to the resultant, followed by stirring and mixing to obtain the solution of the silicone composition-29 for use in a printing plate.
(a) "Isopar" (registered trademark) E: 894.05 parts by mass
(b) "DMS"-V35: 88.31 parts by mass
(c) "HMS"-301: 7.64 parts by mass
(d) Vinyltriacetoxysilane: 4.00 parts by mass
(e) γ-picoline: 1.00 parts by mass
(f) XC94-C4326: 5.00 parts by mass The ratio of the number of SiH groups to the number of vinyl groups (the number of SiH groups/the number of vinyl groups) in the silicone rubber layer was 1.5.

Comparative Example 2

The production of a planographic printing plate precursor, the production of a printing plate using the precursor, and the evaluations thereof were carried out in the same manner as in Comparative Example 1, except for using the following solution of a silicone composition-30 for use in a printing plate, instead of the solution of the silicone composition-29 for use in a printing plate.

<Solution of Silicone Composition-30 for Use in Printing Plate>
(a) "Isopar" (registered trademark) E: 894.05 parts by mass
(b) "DMS"-V35: 89.92 parts by mass
(c) "HMS"-301: 6.03 parts by mass
(d) Vinyltris(methylethylketoximino)silane: 4.00 parts by mass
(e) γ-picoline: 1.00 parts by mass
(f) XC94-C4326: 5.00 parts by mass The ratio of the number of SiH groups to the number of vinyl groups (the number of SiH groups/the number of vinyl groups) in the silicone rubber layer was 1.5.

Comparative Example 3

The production of a planographic printing plate precursor, the production of a printing plate using the precursor, and the evaluations thereof were carried out in the same manner as in Comparative Example 1, except for using the following solution of a silicone composition-31 for use in a printing plate, instead of the solution of the silicone composition-29 for use in a printing plate.

<Solution of Silicone Composition-31 for Use in Printing Plate>
(a) "Isopar" (registered trademark) E: 894.05 parts by mass
(b) "DMS"-V35: 94.21 parts by mass
(c) "HMS"-301: 3.74 parts by mass
(d) Vinyltris(methylethylketoximino)silane: 2.00 parts by mass
(e) γ-picoline: 1.00 parts by mass
(f) XC94-C4326: 5.00 parts by mass The ratio of the number of SiH groups to the number of vinyl groups (the number of SiH groups/the number of vinyl groups) in the silicone rubber layer was 1.5.

Comparative Example 4

The production of a planographic printing plate precursor, the production of a printing plate using the precursor, and the evaluations thereof were carried out in the same manner as in Comparative Example 1, except for using the following solution of a silicone composition-32 for use in a printing plate, instead of the solution of the silicone composition-29 for use in a printing plate.

<Solution of Silicone Composition-32 for Use in Printing Plate>
(a) "Isopar" (registered trademark) E: 894.05 parts by mass
(b) "DMS"-V35: 87.78 parts by mass
(c) "HMS"-301: 7.17 parts by mass
(d) Vinyltris(methylethylketoximino)silane: 5.00 parts by mass
(e) γ-picoline: 1.00 parts by mass
(f) XC94-C4326: 5.00 parts by mass The ratio of the number of SiH groups to the number of vinyl groups (the number of SiH groups/the number of vinyl groups) in the silicone rubber layer was 1.5.

Comparative Example 5

The production of a planographic printing plate precursor, the production of a printing plate using the precursor, and the evaluations thereof were carried out in the same manner as in Comparative Example 1, except for using the following solution of a silicone composition-33 for use in a printing plate, instead of the solution of the silicone composition-29 for use in a printing plate.

<Solution of Silicone Composition-33 for Use in Printing Plate>
(a) "Isopar" (registered trademark) E: 894.05 parts by mass
(b) "DMS"-V35: 87.96 parts by mass
(c) "HMS"-301: 7.99 parts by mass
(d) Vinyltris(methylethylketoximino)silane: 4.00 parts by mass
(e) γ-picoline: 1.00 parts by mass
(f) XC94-C4326: 5.00 parts by mass The ratio of the number of SiH groups to the number of vinyl groups (the number of SiH groups/the number of vinyl groups) in the silicone rubber layer was 2.0.

Comparative Example 6

The production of a planographic printing plate precursor, the production of a printing plate using the precursor, and the evaluations thereof were carried out in the same manner as in Comparative Example 2, except that the film mass of the silicone rubber layer in Comparative Example 2 was changed to 1.6 g/m$^2$.

Comparative Example 7

The production of a planographic printing plate precursor, the production of a printing plate using the precursor, and the evaluations thereof were carried out in the same manner as in Comparative Example 1, except for using the following solution of a silicone composition-34 for use in a printing plate, instead of the solution of the silicone composition-29 for use in a printing plate.

<Solution of Silicone Composition-34 for Use in Printing Plate>
(a) "Isopar" (registered trademark) E: 894.05 parts by mass
(b) "DMS"-V35: 94.55 parts by mass
(c) "HMS"-301: 1.40 parts by mass
(d) Phenyltriacetoxysilane: 4.00 parts by mass
(e) γ-picoline: 1.00 parts by mass
(f) XC94-C4326: 5.00 parts by mass The ratio of the number of SiH groups to the number of vinyl groups (the number of SiH groups/the number of vinyl groups) in the silicone rubber layer was 1.5.

Comparative Example 8

The production of a planographic printing plate precursor, the production of a printing plate using the precursor, and the evaluations thereof were carried out in the same manner as in Comparative Example 1, except for using the following solution of a silicone composition-35 for use in a printing plate, instead of the solution of the silicone composition-29 for use in a printing plate.

<Solution of Silicone Composition-35 for Use in Printing Plate>
(a) "Isopar" (registered trademark) E: 894.05 parts by mass
(b) "DMS"-V35: 94.55 parts by mass
(c) "HMS"-301: 1.40 parts by mass
(d) Phenyltris(methylethylketoximino)silane: 4.00 parts by mass
(e) γ-picoline: 1.00 parts by mass
(f) XC94-C4326: 5.00 parts by mass The ratio of the number of SiH groups to the number of vinyl groups (the number of SiH groups/the number of vinyl groups) in the silicone rubber layer was 1.5.

Comparative Example 9

The production of a planographic printing plate precursor, the production of a printing plate using the precursor, and the evaluations thereof were carried out in the same manner as in Example 1, except for using the following solution of a silicone composition-36 for use in a printing plate, instead of the solution of the silicone composition-1 for use in a printing plate.

<Solution of Silicone Composition-36 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltris(methylethylketoximino)silane: 1.00 parts by mass
(e) Compound represented by the general formula (II): 3-glycidoxypropyltrimethoxysilane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

Comparative Example 10

The production of a planographic printing plate precursor, the production of a printing plate using the precursor, and the evaluations thereof were carried out in the same manner as in Example 1, except for using the following solution of a silicone composition-37 for use in a printing plate, instead of the solution of the silicone composition-1 for use in a printing plate.

<Solution of Silicone Composition-37 for Use in Printing Plate>
(a) "Isopar" (registered trademark) E: 894.05 parts by mass
(b) "DMS"-V35: 93.39 parts by mass
(c) "HMS"-301: 2.56 parts by mass
(d) Vinyltris(methylethylketoximino)silane: 1.00 parts by mass
(e) Compound represented by the general formula (II): 3-isocyanatopropyltriethoxysilane: 3.00 parts by mass
(f) γ-picoline: 1.00 parts by mass
(g) XC94-C4326: 5.00 parts by mass The ratio of the number of SiH groups to the number of vinyl groups (the number of SiH groups/the number of vinyl groups) in the silicone rubber layer was 1.5.

The conditions for the solution of the silicone composition for use in a printing plate and the silicone rubber layer, prepared in each of the Examples 1 to 28, Reference Example, and Comparative Examples 1 to 10 are shown in Table 1; and the evaluation results are shown in Table 2.

In Reference Example, since the silicone rubber layer in the planographic printing plate precursor had not been cured, it was unable to evaluate any of the adhesion between the silicone rubber layer and the heat sensitive layer, the ink repellency, and the scratch resistance (neither the production of the planographic printing plate nor the printing was performed).

Further, in the developed planographic printing plate in each of Comparative Example 7 and Comparative Example 8, most of the portions of the silicone rubber layer intended to be retained had peeled off, and it was unable to evaluate the ink repellency and the scratch resistance (printing was not performed).

TABLE 1

|  | Compound of General Formula (I) | | Compound(s) of General Formula (II) and/or General Formula (III) | |
|---|---|---|---|---|
|  | Type | Parts by mass | Type | Parts by mass |
| Example 1 | Vinyltriacetoxysilane | 0.74 | Methyltriacetoxysilane | 3.26 |
| Example 2 | Vinyltriacetoxysilane | 0.74 | Ethyltriacetoxysilane | 3.26 |
| Example 3 | Vinyltriacetoxysilane | 0.74 | Phenyltriacetoxysilane | 3.26 |
| Example 4 | Vinyltriacetoxysilane | 0.74 | Methyltris (methylethylketoximino) silane | 3.26 |
| Example 5 | Vinyltriacetoxysilane | 0.74 | Phenyltris (methylethylketoximino) silane | 3.26 |
| Example 6 | Vinyltris (methylethylketoximino) silane | 1.00 | Methyltriacetoxysilane | 3.00 |
| Example 7 | Vinyltris (methylethylketoximino) silane | 1.00 | Ethyltriacetoxysilane | 3.00 |
| Example 8 | Vinyltris (methylethylketoximino) silane | 1.00 | Phenyltriacetoxysilane | 3.00 |
| Example 9 | Vinyltris (methylethylketoximino) silane | 1.00 | Methyltris (methylethylketoximino) silane | 3.00 |
| Example 10 | Vinyltris (methylethylketoximino) silane | 1.00 | Phenyltris (methylethylketoximino) silane | 3.00 |
| Example 11 | Vinyltris (methylethylketoximino) silane | 0.50 | Phenyltris (methylethylketoximino) silane | 3.50 |
| Example 12 | Vinyltris (methylethylketoximino) silane | 1.50 | Phenyltris (methylethylketoximino) silane | 2.50 |
| Example 13 | Vinyltris (methylethylketoximino) silane | 2.50 | Phenyltris (methylethylketoximino) silane | 1.50 |
| Example 14 | Vinyltris (methylethylketoximino) silane | 3.50 | Phenyltris (methylethylketoximino) silane | 0.50 |
| Example 15 | Vinyltris (methylethylketoximino) silane | 1.00 | Phenyltris (methylethylketoximino) silane | 1.00 |
| Example 16 | Vinyltris (methylethylketoximino) silane | 1.00 | Phenyltris (methylethylketoximino) silane | 2.00 |
| Example 17 | Vinyltris (methylethylketoximino) silane | 1.00 | Phenyltris (methylethylketoximino) silane | 4.00 |
| Example 18 | Vinyltris (methylethylketoximino) silane | 1.00 | Phenyltris (methylethylketoximino) silane | 5.00 |
| Example 19 | Vinyltris (methylethylketoximino) silane | 1.00 | Phenyltris (methylethylketoximino) silane | 3.00 |
| Example 20 | Vinyltris (methylethylketoximino) silane | 1.00 | Phenyltris (methylethylketoximino) silane | 3.00 |
| Example 21 | Vinyltris (methylethylketoximino) silane | 1.00 | Phenyltris (methylethylketoximino) silane | 3.00 |
| Example 22 | Vinyltris (methylethylketoximino) silane | 1.00 | Phenyltris (methylethylketoximino) silane | 3.00 |
| Example 23 | Vinyltris (methylethylketoximino) silane | 1.00 | Phenyltris (methylethylketoximino) silane | 3.00 |
| Example 24 | Vinyltris (methylethylketoximino) silane | 1.00 | Phenyltris (methylethylketoximino) silane | 3.00 |
| Example 25 | Vinyltris (methylethylketoximino) silane | 1.00 | Tetrakis (methylethylketoximino) silane | 3.00 |
| Example 26 | Vinyltris (methylethylketoximino) silane | 1.00 | Phenyltris (methylethylketoximino) silane | 1.50 |
|  |  |  | Tetrakis (methylethylketoximino) silane | 1.50 |
| Example 27 | Vinyltris (methylethylketoximino) silane | 2.00 | Phenyltris (methylethylketoximino) silane | 3.00 |
| Example 28 | Vinyltris (methylethylketoximino) silane | 2.00 | Phenyltris (methylethylketoximino) silane | 3.00 |
| Reference Example | Vinyltris (methylethylketoximino) silane | 1.00 | Phenyltris (methylethylketoximino) silane | 3.00 |
| Comparative Example 1 | Vinyltriaceloxysilane | 4.00 | absence | 0.00 |
| Comparative Example 2 | Vinyltris (methylethylketoximino) silane | 4.00 | absence | 0.00 |
| Comparative Example 3 | Vinyltris (methylethylketoximino) silane | 2.00 | absence | 0.00 |
| Comparative Example 4 | Vinyltris (methylethylketoximino) silane | 5.00 | absence | 0.00 |
| Comparative Example 5 | Vinyltris (methylethylketoximino) silane | 4.00 | absence | 0.00 |
| Comparative Example 6 | Vinyltris (methylethylketoximino) silane | 4.00 | absence | 0.00 |
| Comparative Example 7 | absence | 0.00 | Phenyltriacetoxysilane | 4.00 |
| Comparative Example 8 | absence | 0.00 | Phenyltris (methylethylketoximino) silane | 4.00 |
| Comparative Example 9 | Vinyltris (methylethylketoximino) silane | 1.00 | 3-glycidoxypropyltrimetoxy silane | 3.00 |
| Comparative Example 10 | Vinyltris (methylethylketoximino) silane | 1.00 | 3-isocyanatepropyltriethoxy silane | 3.00 |

|  | Total Parts by mass | Numbers of SiH groups/ Number of vinyl groups | Silicone Oil [Parts by mass] | Film Mass of Silicone Rubber Layer [g/m$^2$] |
|---|---|---|---|---|
| Example 1 | 4.00 | 1.5 | 0 | 2.0 |
| Example 2 | 4.00 | 1.5 | 0 | 2.0 |
| Example 3 | 4.00 | 1.5 | 0 | 2.0 |
| Example 4 | 4.00 | 1.5 | 0 | 2.0 |
| Example 5 | 4.00 | 1.5 | 0 | 2.0 |
| Example 6 | 4.00 | 1.5 | 0 | 2.0 |
| Example 7 | 4.00 | 1.5 | 0 | 2.0 |
| Example 8 | 4.00 | 1.5 | 0 | 2.0 |
| Example 9 | 4.00 | 1.5 | 0 | 2.0 |
| Example 10 | 4.00 | 1.5 | 0 | 2.0 |
| Example 11 | 4.00 | 1.5 | 0 | 2.0 |
| Example 12 | 4.00 | 1.5 | 0 | 2.0 |
| Example 13 | 4.00 | 1.5 | 0 | 2.0 |
| Example 14 | 4.00 | 1.5 | 0 | 2.0 |
| Example 15 | 2.00 | 1.5 | 0 | 2.0 |
| Example 16 | 3.00 | 1.5 | 0 | 2.0 |

TABLE 1-continued

|  |  |  |  |  |
|---|---|---|---|---|
| Example 17 | 5.00 | 1.5 | 0 | 2.0 |
| Example 18 | 6.00 | 1.5 | 0 | 2.0 |
| Example 19 | 4.00 | 1.0 | 0 | 2.0 |
| Example 20 | 4.00 | 2.0 | 0 | 2.0 |
| Example 21 | 4.00 | 3.0 | 0 | 2.0 |
| Example 22 | 4.00 | 1.5 | 10 | 2.0 |
| Example 23 | 4.00 | 1.5 | 20 | 2.0 |
| Example 24 | 4.00 | 1.5 | 0 | 1.6 |
| Example 25 | 4.00 | 1.5 | 0 | 2.0 |
| Example 26 | 4.00 | 1.5 | 0 | 2.0 |
| Example 27 | 5.00 | 1.5 | 20 | 2.0 |
| Example 28 | 5.00 | 1.5 | 20 | 2.0 |
| Reference Example | 4.00 | 0.5 | 0 | 2.0 |
| Comparative Example 1 | 4.00 | 1.5 | 0 | 2.0 |
| Comparative Example 2 | 4.00 | 1.5 | 0 | 2.0 |
| Comparative Example 3 | 2.00 | 1.5 | 0 | 2.0 |
| Comparative Example 4 | 5.00 | 1.5 | 0 | 2.0 |
| Comparative Example 5 | 4.00 | 2.0 | 0 | 2.0 |
| Comparative Example 6 | 4.00 | 1.5 | 0 | 1.6 |
| Comparative Example 7 | 4.00 | 1.5 | 0 | 2.0 |
| Comparative Example 8 | 4.00 | 1.5 | 0 | 2.0 |
| Comparative Example 9 | 4.00 | 1.5 | 0 | 2.0 |
| Comparative Example 10 | 4.00 | 1.5 | 0 | 2.0 |

TABLE 2

|  | Shadow Halftone Dot Repeatability | Ink Repellency Oil-based ink 500 sheets | Ink Repellency Oil-based ink 5000 sheets | Ink Repellency Water-soluble ink 500 sheets | Ink Repellency Water-soluble ink 5000 sheets |
|---|---|---|---|---|---|
| Example 1 | 97.0% | excellent | excellent | excellent | excellent |
| Example 2 | 96.0% | excellent | excellent | excellent | excellent |
| Example 3 | 98.0% | excellent | excellent | excellent | excellent |
| Example 4 | 98.0% | excellent | excellent | excellent | excellent |
| Example 5 | 99.0% | excellent | excellent | excellent | excellent |
| Example 6 | 98.0% | excellent | excellent | excellent | excellent |
| Example 7 | 97.0% | excellent | excellent | excellent | excellent |
| Example 8 | 99.0% | excellent | excellent | excellent | excellent |
| Example 9 | 99.0% | excellent | excellent | excellent | excellent |
| Example 10 | 99.5% | excellent | excellent | excellent | excellent |
| Example 11 | 99.0% | excellent | excellent | excellent | excellent |
| Example 12 | 99.5% | excellent | excellent | excellent | excellent |
| Example 13 | 99.5% | excellent | excellent | excellent | excellent |
| Example 14 | 99.5% | good | good | good | good |
| Example 15 | 95.0% | excellent | excellent | excellent | excellent |
| Example 16 | 99.0% | excellent | excellent | excellent | excellent |
| Example 17 | 99.5% | excellent | excellent | excellent | excellent |
| Example 18 | 99.5% | excellent | excellent | excellent | excellent |
| Example 19 | 99.5% | excellent | excellent | excellent | excellent |
| Example 20 | 99.0% | excellent | excellent | excellent | excellent |
| Example 21 | 98.0% | excellent | excellent | excellent | excellent |
| Example 22 | 99.5% | excellent | excellent | excellent | excellent |
| Example 23 | 99.5% | excellent | good | excellent | good |
| Example 24 | 99.5% | good | good | good | good |
| Example 25 | 99.5% | excellent | excellent | excellent | excellent |
| Example 26 | 99.5% | excellent | excellent | excellent | excellent |
| Example 27 | 99.5% | excellent | good | excellent | good |
| Example 28 | 99.5% | excellent | excellent | excellent | excellent |
| Reference Example | Slicone layer uncured | unevaluable | unevaluable | unevaluable | unevaluable |
| Comparative Example 1 | 98.0% | good | good | good | good |
| Comparative Example 2 | 99.0% | good | good | good | good |
| Comparative Example 3 | 95.0% | excellent | excellent | excellent | excellent |
| Comparative Example 4 | 99.5% | fair | fair | fair | fair |
| Comparative Example 5 | 98.0% | fair | fair | fair | fair |
| Comparative Example 6 | 99.5% | fair | fair | fair | fair |
| Comparative Example 7 | Slicone layer peeled | unevaluable | unevaluable | unevaluable | unevaluable |
| Comparative Example 8 | Slicone layer peeled | unevaluable | unevaluable | unevaluable | unevaluable |
| Comparative Example 9 | 90.0% | excellent | excellent | excellent | excellent |
| Comparative Example | 90.0% | excellent | excellent | excellent | excellent |

TABLE 2-continued

|  | Ink Repellency | | | | Scratch |
|  | UV ink | | Aqueous ink | | |
|  | 500 sheets | 5000 sheets | 500 sheets | 5000 sheets | Resistance |
|---|---|---|---|---|---|
| Example 1 | good | good | fair | fair | bad |
| Example 2 | good | good | fair | fair | bad |
| Example 3 | good | good | fair | fair | good |
| Example 4 | good | good | fair | fair | good |
| Example 5 | good | good | fair | fair | excellent |
| Example 6 | good | good | fair | fair | bad |
| Example 7 | good | good | fair | fair | bad |
| Example 8 | good | good | fair | fair | good |
| Example 9 | good | good | fair | fair | good |
| Example 10 | good | good | fair | fair | excellent |
| Example 11 | excellent | excellent | good | good | excellent |
| Example 12 | good | good | fair | fair | excellent |
| Example 13 | fair | fair | bad | bad | excellent |
| Example 14 | bad | bad | worse | worse | excellent |
| Example 15 | excellent | excellent | good | good | excellent |
| Example 16 | good | good | fair | fair | excellent |
| Example 17 | good | good | fair | fair | excellent |
| Example 18 | fair | fair | bad | bad | excellent |
| Example 19 | excellent | excellent | good | good | excellent |
| Example 20 | good | good | fair | fair | excellent |
| Example 21 | fair | fair | bad | bad | excellent |
| Example 22 | excellent | excellent | good | good | good |
| Example 23 | excellent | excellent | excellent | excellent | bad |
| Example 24 | bad | bad | worse | worse | excellent |
| Example 25 | good | good | fair | fair | bad |
| Example 26 | good | good | fair | fair | good |
| Example 27 | excellent | excellent | excellent | excellent | bad |
| Example 28 | excellent | excellent | excellent | excellent | excellent |
| Reference Example | unevaluable | unevaluable | unevaluable | unevaluable | unevaluable |
| Comparative Example 1 | bad | bad | worse | worse | worse |
| Comparative Example 2 | bad | bad | worse | worse | good |
| Comparative Example 3 | good | good | fair | fair | worse |
| Comparative Example 4 | worse | worse | worse | worse | good |
| Comparative Example 5 | worse | worse | worse | worse | bad |
| Comparative Example 6 | worse | worse | worse | worse | bad |
| Comparative Example 7 | unevaluable | unevaluable | unevaluable | unevaluable | unevaluable |
| Comparative Example 8 | unevaluable | unevaluable | unevaluable | unevaluable | unevaluable |
| Comparative Example 9 | good | good | fair | fair | bad |
| Comparative Example | good | good | fair | fair | bad |

DESCRIPTION OF SYMBOLS

1 ink roller
2 planographic printing plate
3 plate cylinder
4 blanket cylinder
5 medium to be printed
6 impression cylinder

INDUSTRIAL APPLICABILITY

The present invention provides a silicone composition for use in a printing plate, for obtaining a planographic printing plate precursor or a planographic printing plate which includes a silicone rubber layer having an excellent adhesion to an underlying layer despite being a fast-curing silicone rubber layer, and which has an excellent ink repellency and scratch resistance. Further, the present invention provides a planographic printing plate precursor produced using the silicone composition for use in a printing plate, and a method of producing the same, and a method of producing a planographic printing plate using the plate precursor. In addition, the present invention provides a method of producing a printed matter using the planographic printing plate.

The invention claimed is:

1. A silicone composition for use in a printing plate, the composition comprising at least: a SiH group-containing compound; a compound represented by the following general formula (I); and a compound represented by the following general formula (II);
wherein D in the compound represented by the general formula (I) and G in the compound represented by the general formula (II) each represents an acetoxy group or a dialkyloximino group:

$$A\text{-}Si\text{-}(D)_3 \quad (I);$$

wherein in the general formula (I), A represents a non-hydrolyzable functional group capable of undergoing a hydrosilylation reaction with a SiH group;

$$E\text{-}Si\text{-}(G)_3 \quad (II);$$

wherein in the general formula (II), E represents a non-hydrolyzable functional group incapable of undergoing a hydrosilylation reaction with a SiH group.

2. A silicone composition for use in a printing plate, the composition comprising at least: a SiH group-containing compound; a compound represented by the general formula (I); and a compound represented by the following general formula (III);

wherein D in the compound represented by the general formula (I) and J in the compound represented by the general formula (III) each represents an acetoxy group or a dialkyloximino group:

  (I);

wherein in the general formula (I), A represents a non-hydrolyzable functional group capable of undergoing a hydrosilylation reaction with a SiH group;

$Si\text{-}(J)_4$  (III).

3. A silicone composition for use in a printing plate, the composition comprising at least: a SiH group-containing compound; a compound represented by the general formula (I); a compound represented by the general formula (II); and a compound represented by the general formula (III);

wherein D in the compound represented by the general formula (I), G in the compound represented by the general formula (II), and J in the compound represented by the general formula (III) each represents an acetoxy group or a dialkyloximino group;

  (I);

wherein in the general formula (I), A represents a non-hydrolyzable functional group capable of undergoing a hydrosilylation reaction with a SiH group;

  (II);

wherein in the general formula (II), E represents a non-hydrolyzable functional group incapable of undergoing a hydrosilylation reaction with a SiH group;

$Si\text{-}(J)_4$  (III).

4. The silicone composition for use in a printing plate according to claim 1, wherein A in the compound represented by the general formula (I) is a vinyl group.

5. The silicone composition for use in a printing plate according to claim 1, wherein E in the compound represented by the general formula (II) is a functional group represented by the following general formula (IV):

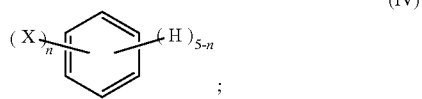

wherein in the general formula (IV), each X represents a halogen atom or any one of linear, branched, and cyclic saturated hydrocarbon groups having from 1 to 6 carbon atoms; and n represents an integer of from 0 to 5.

6. The silicone composition for use in a printing plate according to claim 1, wherein the ratio of the number of SiH groups to the number of functional groups capable of undergoing a hydrosilylation reaction with SiH groups (number of SiH groups/number of functional groups capable of undergoing a hydrosilylation reaction with SiH groups), contained in the silicone composition for use in a printing plate, is 1 or more and 2 or less.

7. The silicone composition for use in a printing plate according to claim 1,
wherein the content of the compound represented by the general formula (I) is within the range of from 0.5 to 2% by mass with respect to the total amount of the silicone composition for use in a printing plate, and the content of the compound represented by the general formula (II) and/or a compound represented by the following general formula (III) is within the range of from 0.5 to 5.5% by mass with respect to the total amount of the silicone composition for use in a printing plate; and wherein the total of the content (% by mass) of the compound represented by the general formula (I) and the content (% by mass) of the compound represented by the general formula (II) and/or the compound represented by the general formula (III) is within the range of from 2.5 to 6% by mass, with respect to the total amount of the silicone composition for use in a printing plate;

$Si\text{-}(J)_4$  (III);

wherein each J in the compound represented by the general formula (III) represents an acetoxy group or a dialkyloximino group.

8. The silicone composition for use in a printing plate according to claim 1, wherein the composition further comprises a silanol group-containing compound.

9. The silicone composition for use in a printing plate according to claim 1, wherein the composition further comprises a liquid having a surface tension at 25° C. of 30 mN/m or less.

10. A planographic printing plate precursor comprising: a substrate; and at least a silicone rubber layer provided on the substrate; wherein the silicone rubber layer is a cured product obtained by curing the silicone composition for use in a printing plate according to claim 1.

11. A method of producing a planographic printing plate precursor, the precursor comprising: a substrate; and at least a silicone rubber layer provided on the substrate; and the method comprising the step of curing the silicone composition for use in a printing plate according to claim 1, with or without heating, to form a cured product, as the silicone rubber layer.

12. A method of producing a planographic printing plate, using the planographic printing plate precursor according to claim 10.

13. A method of producing a printed matter, using an ink, and a planographic printing plate obtained by the method of producing a planographic printing plate according to claim 12.

14. The method of producing a printed matter according to claim 13, wherein the ink is an active energy ray-curable ink.

15. The method of producing a printed matter according to claim 13, wherein the ink is an aqueous ink.

16. The silicone composition for use in a printing plate according to claim 2, wherein A in the compound represented by the general formula (I) is a vinyl group.

17. The silicone composition for use in a printing plate according to claim 3, wherein A in the compound represented by the general formula (I) is a vinyl group.

18. The silicone composition for use in a printing plate according to claim 3, wherein E in the compound represented by the general formula (II) is a functional group represented by the following general formula (IV):

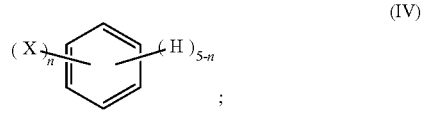

wherein in the general formula (IV), each X represents a halogen atom or any one of linear, branched, and cyclic saturated hydrocarbon groups having from 1 to 6 carbon atoms; and n represents an integer of from 0 to 5.

19. The silicone composition for use in a printing plate according to claim 2, wherein the ratio of the number of SiH groups to the number of functional groups capable of undergoing a hydrosilylation reaction with SiH groups (number of SiH groups/number of functional groups capable of undergoing a hydrosilylation reaction with SiH groups), contained in the silicone composition for use in a printing plate, is 1 or more and 2 or less.

20. The silicone composition for use in a printing plate according to claim 3, wherein the ratio of the number of SiH groups to the number of functional groups capable of undergoing a hydrosilylation reaction with SiH groups (number of SiH groups/number of functional groups capable of undergoing a hydrosilylation reaction with SiH groups), contained in the silicone composition for use in a printing plate, is 1 or more and 2 or less.

* * * * *